United States Patent
Cote et al.

(10) Patent No.: US 8,759,473 B2
(45) Date of Patent: *Jun. 24, 2014

(54) HIGH MOBILITY PERIODIC STRUCTURED ORGANIC FILMS

(75) Inventors: Adrien P. Cote, Clarkson (CA); Matthew A. Heuft, Oakville (CA)

(73) Assignee: Xerox Corporation, Norwalk, CT (US)

( * ) Notice: Subject to any disclaimer, the term of this patent is extended or adjusted under 35 U.S.C. 154(b) by 555 days.

This patent is subject to a terminal disclaimer.

(21) Appl. No.: 13/042,950

(22) Filed: Mar. 8, 2011

(65) Prior Publication Data

US 2012/0232308 A1  Sep. 13, 2012

(51) Int. Cl.
*C07D 265/00* (2006.01)
*C07C 211/00* (2006.01)

(52) U.S. Cl.
USPC ......... 528/211; 252/182.3; 257/40; 427/384; 427/542; 427/557; 427/372.2; 428/332

(58) Field of Classification Search
USPC ............. 528/211; 252/181.12, 182.3; 257/40; 427/384, 542, 557; 428/332; 544/71; 564/305; 568/608; 548/409
See application file for complete search history.

(56) References Cited

U.S. PATENT DOCUMENTS

| | | | |
|---|---|---|---|
| 2,324,550 A | 7/1943 | Wolfe | |
| 3,430,418 A | 3/1969 | Wagner | |
| 3,801,315 A | 4/1974 | Gundlach et al. | |
| 4,078,927 A | 3/1978 | Amidon et al. | |
| 4,081,274 A | 3/1978 | Horgan | |
| 4,115,116 A | 9/1978 | Stolka et al. | |
| 4,233,384 A | 11/1980 | Turner et al. | |
| 4,257,699 A | 3/1981 | Lentz | |
| 4,265,990 A | 5/1981 | Stolka et al. | |
| 4,286,033 A | 8/1981 | Neyhart et al. | |
| 4,291,110 A | 9/1981 | Lee | |
| 4,299,897 A | 11/1981 | Stolka et al. | |
| 4,304,829 A | 12/1981 | Limburg et al. | |
| 4,306,008 A | 12/1981 | Pai et al. | |
| 4,338,387 A | 7/1982 | Hewitt | |
| 4,346,387 A | 8/1982 | Hertz | |
| 4,387,980 A | 6/1983 | Ueno et al. | |
| 4,457,994 A | 7/1984 | Pai et al. | |
| 4,464,450 A | 8/1984 | Teuscher | |
| 4,489,593 A | 12/1984 | Pieters et al. | |
| 4,493,550 A | 1/1985 | Takekida | |
| 4,664,995 A | 5/1987 | Horgan et al. | |
| 4,855,203 A | 8/1989 | Badesha et al. | |
| 4,871,634 A | 10/1989 | Limburg et al. | |

(Continued)

FOREIGN PATENT DOCUMENTS

| | | |
|---|---|---|
| CA | 2 753 863 | 9/2010 |
| CA | 2 753 891 | 9/2010 |

(Continued)

OTHER PUBLICATIONS

Pandey et al. Chem. Mater. 2010, 22, 4974-49-79.*

(Continued)

*Primary Examiner* — Mark Kaucher
(74) *Attorney, Agent, or Firm* — Oliff PLC

(57) ABSTRACT

An high mobility structured organic film comprising a plurality of segments and a plurality of linkers arranged as a covalent organic framework, wherein the structured organic film may be a multi-segment thick structured organic film.

18 Claims, 9 Drawing Sheets

(56) References Cited

U.S. PATENT DOCUMENTS

| | | |
|---|---|---|
| 4,917,711 A | 4/1990 | Xie et al. |
| 4,921,769 A | 5/1990 | Yuh et al. |
| 4,921,773 A | 5/1990 | Melnyk et al. |
| 4,996,125 A | 2/1991 | Sakaguchi et al. |
| 5,017,432 A | 5/1991 | Eddy et al. |
| 5,061,965 A | 10/1991 | Ferguson et al. |
| 5,110,693 A | 5/1992 | Friend et al. |
| 5,139,910 A | 8/1992 | Law et al. |
| 5,165,909 A | 11/1992 | Tennent et al. |
| 5,166,031 A | 11/1992 | Badesha et al. |
| 5,231,162 A | 7/1993 | Nagata |
| 5,281,506 A | 1/1994 | Badesha et al. |
| 5,300,271 A | 4/1994 | Golden et al. |
| 5,366,772 A | 11/1994 | Badesha et al. |
| 5,368,913 A | 11/1994 | Ortega |
| 5,368,967 A | 11/1994 | Schank et al. |
| 5,370,931 A | 12/1994 | Fratangelo et al. |
| 5,432,539 A | 7/1995 | Anderson |
| 5,455,136 A | 10/1995 | Yu et al. |
| 5,456,897 A | 10/1995 | Moy et al. |
| 5,500,200 A | 3/1996 | Mandeville et al. |
| 5,569,635 A | 10/1996 | Moy et al. |
| 5,658,702 A | 8/1997 | Nukada |
| 5,702,854 A | 12/1997 | Schank et al. |
| 5,707,916 A | 1/1998 | Snyder et al. |
| 5,853,906 A | 12/1998 | Hsieh |
| 5,877,110 A | 3/1999 | Snyder et al. |
| 5,976,744 A | 11/1999 | Fuller et al. |
| 6,002,907 A | 12/1999 | Berkes |
| 6,020,426 A | 2/2000 | Yamaguchi et al. |
| 6,107,117 A | 8/2000 | Bao et al. |
| 6,107,439 A | 8/2000 | Yanus et al. |
| 6,248,686 B1 | 6/2001 | Inagaki et al. |
| 6,340,382 B1 | 1/2002 | Baksh et al. |
| 6,464,756 B1 | 10/2002 | Plee |
| 6,505,921 B2 | 1/2003 | Chwalek et al. |
| 6,819,224 B2 | 11/2004 | Brierley |
| 6,819,244 B2 | 11/2004 | Dukler et al. |
| 7,067,687 B2 | 6/2006 | Pinnavaia et al. |
| 7,177,572 B2 | 2/2007 | DiRubio et al. |
| 7,196,210 B2 | 3/2007 | Yaghi et al. |
| 7,202,002 B2 | 4/2007 | Tokarski et al. |
| 7,384,717 B2 | 6/2008 | Dinh et al. |
| 7,416,824 B2 | 8/2008 | Kondoh et al. |
| 7,560,205 B2 | 7/2009 | Qi et al. |
| 7,582,798 B2 | 9/2009 | Yaghi et al. |
| 7,799,495 B2 | 9/2010 | Wu et al. |
| 8,065,904 B1 | 11/2011 | Allendorf et al. |
| 8,093,347 B2 | 1/2012 | Heuft et al. |
| 8,119,314 B1 | 2/2012 | Heuft et al. |
| 8,119,315 B1 | 2/2012 | Heuft et al. |
| 8,313,560 B1 | 11/2012 | Cote et al. |
| 8,334,360 B2 | 12/2012 | Heuft et al. |
| 2002/0098346 A1 | 7/2002 | Yitzchaik |
| 2003/0054948 A1 | 3/2003 | Pinnavaia et al. |
| 2003/0099845 A1 | 5/2003 | Ogawa et al. |
| 2003/0126989 A1 | 7/2003 | Bancon et al. |
| 2003/0172808 A1 | 9/2003 | Le Bec |
| 2004/0147664 A1 | 7/2004 | Lee et al. |
| 2004/0171482 A1 | 9/2004 | Pinnavaia et al. |
| 2004/0244865 A1 | 12/2004 | Jung et al. |
| 2005/0017633 A1 | 1/2005 | Miyadera |
| 2005/0257685 A1 | 11/2005 | Baksh et al. |
| 2005/0260443 A1 | 11/2005 | Marks et al. |
| 2006/0046169 A1 | 3/2006 | Shoshi |
| 2006/0097393 A1 | 5/2006 | Uchimaru et al. |
| 2006/0154807 A1 | 7/2006 | Yaghi et al. |
| 2006/0182993 A1 | 8/2006 | Ogata et al. |
| 2006/0204742 A1 | 9/2006 | Gronbeck et al. |
| 2006/0236862 A1 | 10/2006 | Golden et al. |
| 2007/0123606 A1 | 5/2007 | Toma et al. |
| 2007/0287220 A1 | 12/2007 | Jeong et al. |
| 2008/0107980 A1 | 5/2008 | De Jong et al. |
| 2008/0132669 A1 | 6/2008 | Eriguchi et al. |
| 2008/0233343 A1 | 9/2008 | Cheng et al. |
| 2008/0268135 A1 | 10/2008 | Yokoyama et al. |
| 2008/0316247 A1 | 12/2008 | Cellura et al. |
| 2009/0025555 A1 | 1/2009 | Lively et al. |
| 2009/0046125 A1 | 2/2009 | Nystrom et al. |
| 2009/0053417 A1 | 2/2009 | Mino |
| 2009/0117476 A1 | 5/2009 | Heuft et al. |
| 2009/0149565 A1 | 6/2009 | Liu et al. |
| 2009/0208857 A1 | 8/2009 | Wu et al. |
| 2010/0015540 A1 | 1/2010 | Dinh et al. |
| 2010/0068635 A1 | 3/2010 | Tanaka |
| 2010/0143693 A1 | 6/2010 | Yaghi et al. |
| 2010/0224867 A1 | 9/2010 | Heuft et al. |
| 2010/0227071 A1 | 9/2010 | Heuft et al. |
| 2010/0227998 A1 | 9/2010 | Heuft et al. |
| 2010/0228025 A1 | 9/2010 | Cote et al. |
| 2010/0240781 A1 | 9/2010 | Cooper et al. |
| 2011/0011128 A1 | 1/2011 | Grover |
| 2011/0030555 A1 | 2/2011 | Jonschker et al. |
| 2011/0076605 A1 | 3/2011 | Doi et al. |
| 2011/0236301 A1 | 9/2011 | Kang et al. |
| 2012/0029236 A1 | 2/2012 | Cote et al. |
| 2012/0031268 A1 | 2/2012 | Yaghi et al. |
| 2012/0040282 A1 | 2/2012 | Heuft et al. |
| 2012/0040283 A1 | 2/2012 | Heuft et al. |
| 2012/0152117 A1 | 6/2012 | Lively et al. |

FOREIGN PATENT DOCUMENTS

| | | |
|---|---|---|
| CA | 2 753 940 | 9/2010 |
| CA | 2 753 945 | 9/2010 |
| DE | 10 2008 011 840 A1 | 9/2009 |
| EP | 0312376 A2 | 4/1989 |
| JP | 9 087849 A | 3/1997 |
| KR | 10-0832309 B1 | 5/2008 |
| WO | WO 91/15813 | 10/1991 |
| WO | WO 2006/064892 A1 | 6/2006 |
| WO | WO 2007/090864 A1 | 8/2007 |
| WO | WO 2007/098263 A2 | 8/2007 |
| WO | WO2008/091976 A1 | 7/2008 |
| WO | WO 2009/022187 A1 | 2/2009 |
| WO | WO 2009/127896 A1 | 10/2009 |
| WO | WO 2010/102018 A1 | 9/2010 |
| WO | WO 2010/102025 A1 | 9/2010 |
| WO | WO 2010/102027 A1 | 9/2010 |
| WO | WO 2010/102036 A1 | 9/2010 |
| WO | WO 2010/102038 A1 | 9/2010 |
| WO | WO 2010/102043 A1 | 9/2010 |

OTHER PUBLICATIONS

Oct. 31, 2012 Search Report issued in GB1217201.1.
Jan. 3, 2013 Notice of Allowance issued in U.S. Appl. No. 13/182,047.
Peter M. Budd; Putting Order into Polymer Networks; Science, 2007, 316, 210-211.
Wan, S., Guo, J., Kim, J., Ihee, H. and Jiang, D.; A Photoconductive Covalent Organic Framework: Self-Condensed Arene Cubes Composed of Eclipsed 2D Polypyrene Sheets for Photocurrent Generation; Angewandte Chemie International Edition, 2009, 48, 5439-5442.
U.S. Appl. No. 13/351,561, filed Jan. 17, 2012 Matthew A. Heuft et al.
U.S. Appl. No. 13/246,109, filed Sep. 27, 2011 Matthew A. Heuft et al.
U.S. Appl. No. 13/246,268, filed Sep. 27, 2011 Matthew A. Heuft et al.
U.S. Appl. No. 13/351,589, filed Jan. 17, 2012 Matthew A. Heuft et al.
Nov. 14, 2011 Notice of Allowance issued in U.S. Appl. No. 12/854,957.
Nov. 14, 2011 Notice of Allowance issued in U.S. Appl. No. 12/854,962.
Sep. 26, 2011 Office Action issued in U.S. Appl. No. 12/854,962.
Sep. 27, 2011 Office Action issued in U.S. Appl. No. 12/854,957.
Nov. 21, 2011 Office Action issued in U.S. Appl. No. 12/815,688.
Feb. 7, 2012 Office Action issued in U.S. Appl. No. 13/173,948.

(56) References Cited

OTHER PUBLICATIONS

Sep. 19, 2011 Notice of Allowance issued in U.S. Appl. No. 12/716,524.
Mar. 29, 2012 Office Action issued in U.S. Appl. No. 12/845,235.
Apr. 6, 2012 Office Action issued in U.S. Appl. No. 13/315,452.
May 16, 2012 Notice of Allowance issued in U.S. Appl. No. 13/173,948.
Shun Wan et al., "A Belt-Shaped, Blue Luminescent, and Semiconducting Covalent Organic Framework," Angew. Chem. Int. Ed., vol. 47, pp. 8826-8830 (published on web Jan. 10, 2008).
Nikolas A. A. Zwaneveld et al., "Organized Formation of 2D Extended Covalent Organic Frameworks at Surfaces," *J. Am. Chem. Soc.*, vol. 130, pp. 6678-6679 (published on web Apr. 30, 2008).
Adrian P. Cote et al., "Porous, Crystalline, Covalent Organic Frameworks," *Science*, vol. 310, pp. 1166-1170 (Nov. 18, 2005).
Hani El-Kaderi et al., "Designed Synthesis of 3D Covalent Organic Frameworks," *Science*, vol. 316, pp. 268-272 (Apr. 13, 2007).
Adrien P. Cote et al., "Reticular Synthesis of Microporous and Mesoporous Covalent Organic Frameworks" *J. Am. Chem. Soc.*, vol. 129, 12914-12915 (published on web Oct. 6, 2007).
Omar M. Yaghi et al., "Reticular synthesis and the design of new materials," *Nature*, vol. 423, pp. 705-714 (Jun. 12, 2003).
Nathan W. Ockwig et al., "Reticular Chemistry: Occurrence and Taxonomy of Nets and Grammar for the Design of Frameworks," *Acc. Chem. Res.*, vol. 38, No. 3, pp. 176-182 (published on web Jan. 19, 2005).
Pierre Kuhn et al., Porous, Covalent Triazine-Based Frameworks Prepared by Ionothermal Synthesis, *Angew. Chem. Int. Ed.*, vol. 47, pp. 3450-3453. (Published on web Mar. 10, 2008).
Jia-Xing Jiang et al., "Conjugated Microporous Poly(aryleneethylnylene) Networks," *Angew. Chem. Int. Ed.*, vol. 46, (2008) pp. 1-5 (Published on web Sep. 26, 2008).
Hunt, J.R. et al. "Reticular Synthesis of Covalent-Organic Borosilicate Frameworks" *J. Am. Chem. Soc.*, vol. 130, (2008), 11872-11873. (published on web Aug. 16, 2008).
Apr. 28, 2010 International Search Report issued in PCT/US 10/26082.
Apr. 28, 2010 Written Opinion issued in PCT/US 10/26082.
Apr. 27, 2010 International Search Report issued in PCT/US 10/26071.
Apr. 27, 2010 Written Opinion issued in PCT/US 10/26071.
Apr. 28, 2010 International Search Report issued in PCT/US 10/26091.
Apr. 28, 2010 Written Opinion issued in PCT/US 10/26091.
Apr. 28, 2010 International Search Report issued in PCT/US 10/26100.
Apr. 28, 2010 Written Opinion issued in PCT/US 10/26100.
Apr. 16, 2010 International Search Report issued in PCT/US 10/26079.
Apr. 16, 2010 Written Opinion issued in PCT/US 10/26079.
Apr. 20, 2010 International Search Report issued in PCT/US 10/26094.
Apr. 20, 2010 Written Opinion issued in PCT/US 10/26094.
U.S. Appl. No. 12/716,571, filed Mar. 3, 2010 Matthew A. Heuft et al.
U.S. Appl. No. 12/716,524, filed Mar. 3, 2010 Matthew A. Heuft et al.
U.S. Appl. No. 12/716,324, filed Mar. 3, 2010 Matthew A. Heuft et al.
U.S. Appl. No. 12/716,686, filed Mar. 3, 2010 Matthew A. Heuft et al.
U.S. Appl. No. 12/716,449, filed Mar. 3, 2010 Adrien Pierre Cote et al.
Cassie, A.B.D. et al., "Wettability of Porous Surfaces," Trans. Faraday Soc., vol. 40, pp. 546-551, Jun. 1944.
U.S. Appl. No. 12/854,962, filed Aug. 12, 2010 Matthew A. Heuft et al.
U.S. Appl. No. 12/815,688, filed Jun. 15, 2010 Adrien P. Cote et al.
U.S. Appl. No. 12/854,957, filed Aug. 12, 2010 Matthew A. Heuft et al.
U.S. Appl. No. 12/845,053, filed Jul. 28, 2010 Adrien P. Cote et al.
U.S. Appl. No. 12/845,235, filed Jul. 28, 2010 Adrien P. Cote et al.
U.S. Appl. No. 12/566,568, filed Sep. 24, 2009 Eugene M. Chow et al.
U.S. Appl. No. 12/566,518, filed Sep. 24, 2009 Eugene M. Chow et al.
U.S. Appl. No. 12/716,706, filed Mar. 3, 2010 Adrien Pierre Cote et al.
U.S. Appl. No. 12/845,052, filed Jul. 28, 2010 Adrien Pierre Cote et al.
Colson et al. "Oriented 2D Covalent Organic Framework Thin Films on Single-Layer Graphene", *Science*, 332, 228-231 (2011).
K.S. Novoselov et al., "Electric Field Effect in Atomically Thin Carbon Films", *Science*, Oct. 22, 2004, pp. 666-669, vol. 306.
Stankovich et al., "Graphene-Based Composite Materials", *Nature*, Jul. 20, 2006, pp. 282-286, vol. 442.
U.S. Appl. No. 13/173,948, filed Jun. 30, 2011 Adrien Pierre Cote et al.
U.S. Appl. No. 13/181,761, filed Jul. 13, 2011 Adrien Pierre Cote et al.
U.S. Appl. No. 13/181,912, filed Jul. 13, 2011 Adrien Pierre Cote et al.
U.S. Appl. No. 13/174,046, filed Jun. 30, 2011 Matthew A. Heuft et al.
U.S. Appl. No. 13/182,047, filed Jul. 13, 2011 Adrien Pierre Cote et al.
Jun. 1, 2011 Office Action issued in U.S. Appl. No. 12/716,524.
Extended European Search Report for European Patent Application No. 10749278.7 dated Aug. 8, 2012.
European Search Report for European Patent Application No. 10749283.7 dated Aug. 10, 2012.
European Search Report for European Patent Application No. 10749285.2 dated Aug. 6, 2012.
European Search Report for European Patent Application No. 10749276.1 dated Aug. 6, 2012.
European Search Report for European Patent Application No. 10749274.6 dated Aug. 6, 2012.
European Search Report for European Patent Application No. 10749289.4 dated Aug. 10, 2012.
Notice of Allowance for U.S. Appl. No. 13/315,452 mailed Aug. 15, 2012.
Sep. 6, 2012 Office Action issued in U.S. Appl. No. 13/182,047.
Sep. 6, 2012 Office Action issued in U.S. Appl. No. 12/716,324.
U.S. Appl. No. 13/804,874, filed Mar. 14, 2013 to Wigglesworth et al.
U.S. Appl. No. 13/748,114, filed Jan. 23, 2013 to Heuft et al.
Mar. 14, 2013 Office Action issued in U.S. Appl. No. 12/845,052.
U.S. Appl. No. 13/746,686, filed Jan. 22, 2013 to Cote et al.
Feb. 15, 2013 Office Action issued in U.S. Appl. No. 12/815,688.
Mar. 13, 2013 Office Action issued in U.S. Appl. No. 12/716,571.
Mar. 12, 2013 Notice of Allowance issued in U.S. Appl. No. 13/246,268.
Mar. 22, 2013 Office Action issued in U.S. Appl. No. 13/246,109.
Jan. 16, 2013 Notice of Allowance issued in U.S. Appl. No. 12/716,449.
Porous, Crystalline, Covalent Organic Framework, Cote, Nov. 18, 2005 vol. 310 Science http://www.sciencemag.org/content/310/5751/1166.full?sid=6bbe3427-6590-4387-afd9-5e4156547de4.
Feb. 1, 2013 Office Action issued in U.S. Appl. No. 13/351,589.
Jun. 10, 2013 Notice of Allowance issued in U.S. Appl. No. 13/351,589.
Apr. 5, 2013 Canadian Office Action issued in Canadian Patent Application No. 2,769,976.
R.J. Jeng et al. "Low Loss Second-Order Nonlinear Optical Polymers Based on All Organic Sol-Gel Materials," Journal of Applied Polymer Science, Jan. 10, 1995, pp. 209-214, vol. 55, No. 2, John Wiley & Sons, Inc.
Apr. 9, 2013 European Office Action issued in European Patent Application No. 10 749 274.
Apr. 9, 2013 European Office Action issued in European Patent Application No. 10 749 276.
Apr. 9, 2013 European Office Action issued in European Patent Application No. 10 749 285.
Apr. 9, 2013 European Office Action issued in European Patent Application No. 10 749 283.
Apr. 9, 2013 European Office Action issued in European Patent Application No. 10 749 278.
Mar. 1, 2013 Chinese Office Action issued in Chinese Patent Application No. 201080019043.4 (with translation).

(56) References Cited

OTHER PUBLICATIONS

Mar. 29, 2013 Chinese Office Action issued in Chinese Patent Application No. 201080019368.2 (with translation).
Jun. 19, 2012 German Search Report issued in Application No. 10 2011 079 277.5 (with translation).
Aug. 10, 2012 Notice of Allowance issued in U.S. Appl. No. 13/181,912.
Aug. 10, 2012 Office Action issued in U.S. Appl. No. 12/716,449.
Aug. 3, 2012 Office Action issued in U.S. Appl. No. 12/716,686.
Jul. 6, 2012 Office Action issued in U.S. Appl. No. 12/716,706.
Aug. 3, 2012 Office Action issued in U.S. Appl. No. 12/815,688.
Jun. 25, 2012 Office Action issued in U.S. Appl. No. 12/845,052.
Aug. 8, 2012 Office Action issued in U.S. Appl. No. 13/181,761.
U.S. Appl. No. 13/572,095, filed Aug. 10, 2012, Sara J. Vella et al.
U.S. Appl. No. 13/571,933, filed Aug. 10, 2012, Sara J. Vella et al.
Aug. 3, 2012 Notice of Allowance issued in U.S. Appl. No. 12/845,053.
Jan. 31, 2014 Office Action issued in Canadian Patent Application No. 2,769,976.
Chesterfield, Reid J. et al., "Organic Thin Film Transistors Based on N-Alkyl Perylene Diimides: Charge Transport Kinetics as a Function of Gate Voltage and Temperature," J. Phys. Chem. B, 108, Nov. 1, 2004, p. 19281-19292.
Gundlach, D.J., et al., "High mobility n-channel organic thin-film transistors and complementary inverters," Journal of Applied Physics, 98, Sep. 26, 2005, p. 64502-1-64502-8.

* cited by examiner

IDEAL ROD BUILDING BLOCK

IDEAL ROD BUILDING BLOCK

DISTORTED ROD BUILDING BLOCK

DISTORTED ROD BUILDING BLOCK

IDEAL TRIANGULAR BUILDING BLOCK

IDEAL TRIANGULAR BUILDING BLOCK

DISTORTED TRIANGULAR BUILDING BLOCK

DISTORTED TRIANGULAR BUILDING BLOCK

IDEAL TETRAHEDRAL BUILDING BLOCK

IDEAL TETRAHEDRAL BUILDING BLOCK

DISTORTED TETRAHEDRAL BUILDING BLOCK

DISTORTED TETRAHEDRAL BUILDING BLOCK

IDEAL SQUARE BUILDING BLOCK

DISTORTED SQUARE/TETRAHEDRAL BUILDING BLOCK

DISTORTED SQUARE/TETRAHEDRAL BUILDING BLOCK

HIGH MOBILITY PERIODIC STRUCTURED ORGANIC FILMS

CROSS-REFERENCE TO RELATED APPLICATIONS

This nonprovisional application is related to U.S. patent application Ser. Nos. 12/716,524; 12/716,449; 12/716,706; 12/716,324; 12/716,686; 12/716,571; 12/815,688; 12/845,053; 12/845,235; 12/854,962; 12/854,957; and 12/845,052 entitled "Structured Organic Films," "Structured Organic Films Having an Added Functionality," "Mixed Solvent Process for Preparing Structured Organic Films," "Composite Structured Organic Films," "Process For Preparing Structured Organic Films (SOFs) Via a Pre-SOF," "Electronic Devices Comprising Structured Organic Films," "Periodic Structured. Organic Films," "Capped Structured Organic Film Compositions," "Imaging Members Comprising Capped Structured Organic Films. Compositions," "Imaging Members for Ink-Based Digital Printing Comprising Structured Organic Films," "Imaging Devices Comprising Structured Organic Films," and "Imaging Members Comprising Structured Organic Films," respectively; and U.S. Provisional Application No. 61/157,411, entitled "Structured Organic Films" filed Mar. 4, 2009, the disclosures of which are totally incorporated herein by reference in their entireties.

BACKGROUND OF THE INVENTION

Materials whose chemical structures are comprised of molecules linked by covalent bonds into extended structures may be placed into two classes: (1) polymers and cross-linked polymers, and (2) covalent organic frameworks (also known as covalently linked organic networks).

The first class, polymers and cross-linked polymers, is typically embodied by polymerization of molecular monomers to form long linear chains of covalently-bonded molecules. Polymer chemistry processes can allow for polymerized chains to, in turn, or concomitantly, become 'cross-linked.' The nature of polymer chemistry offers poor control over the molecular-level structure of the formed material, i.e. the organization of polymer chains and the patterning of molecular monomers between chains is mostly random. Nearly all polymers are amorphous, save for some linear polymers that efficiently pack as ordered rods. Some polymer materials, notably block co-polymers, can possess regions of order within their bulk. In the two preceding cases the patterning of polymer chains is not by design, any ordering at the molecular-level is a consequence of the natural intermolecular packing tendencies.

The second class, covalent organic frameworks (COFs), differ from the first class (polymers/cross-linked polymers) in that COFs are intended to be highly patterned. In COF chemistry molecular components are called molecular building blocks rather than monomers. During COF synthesis molecular building blocks react to form two- or three-dimensional networks. Consequently, molecular building blocks are patterned throughout COF materials and molecular building blocks are linked to each other through strong covalent bonds.

COFs developed thus far are typically powders with high porosity and are materials with exceptionally low density. COFs can store near-record amounts of argon and nitrogen. While these conventional COFs are useful, there is a need, addressed by embodiments of the present invention, for new materials that offer advantages over conventional COFs in terms of enhanced characteristics.

However, the above mentioned polymers, cross-linked polymers, and covalent organic frameworks lack the intrinsic high (electron/hole) mobilities necessary for attaining breakthrough performance in organic electronics. The requisite high mobilities may be achieved by the SOFs of the present disclosure, which have a high degree of long-range molecular-level order (periodic). The high mobility materials of the present disclosure are networked (linked by strong bonds) into periodic structures of provides an opportunity to combine high electrical performance with the inherent chemical and mechanical robustness accessed by networked materials.

SUMMARY OF THE DISCLOSURE

There is provided in embodiments a high mobility ordered (periodic) structured organic film comprising a plurality of segments and a plurality of linkers arranged as a covalent organic framework, wherein at a macroscopic level the covalent organic framework is a film. Such SOFs may possess long-range molecular order (periodic) and consequent exceptional (hole/electron) mobilities. The present disclosure also discloses methods for producing SOFs possessing high mobility by selecting and using designer molecular building blocks and using reaction conditions that promote the ordering of building blocks. High mobility SOFs may be robust films that can be integrated into organic electronic devices (photoreceptor, TFT, solar cell, etc.) and provide breakthrough electrical and lifetime performance.

BRIEF DESCRIPTION OF THE DRAWINGS

Other aspects of the present disclosure will become apparent as the following description proceeds and upon reference to the following figures which represent illustrative embodiments.

DETAILED DESCRIPTION

Figure 1A:
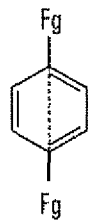
FIGS. 1A-O are illustrations of exemplary building blocks whose symmetrical elements are outlined.
Figure 1B:
Figure 1C:
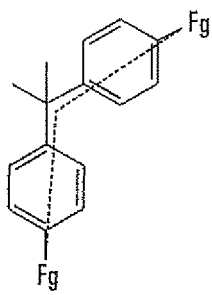
Figure 1D:
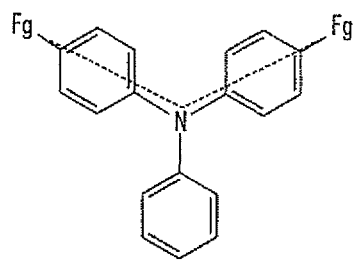
Figure 1E:
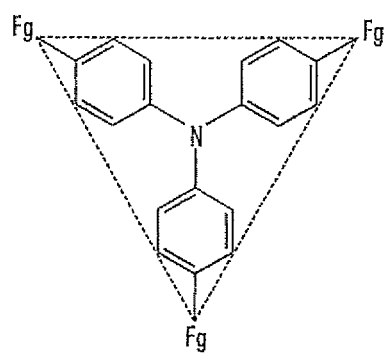
Figure 1F:
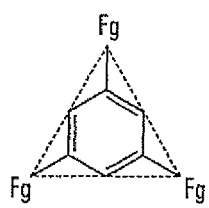
Figure 1G:
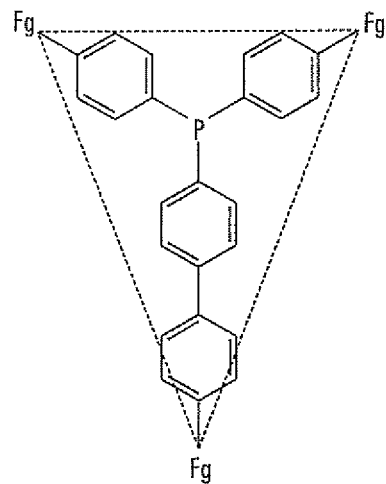
Figure 1H:
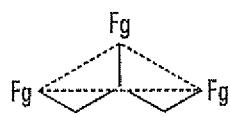
Figure 1I:
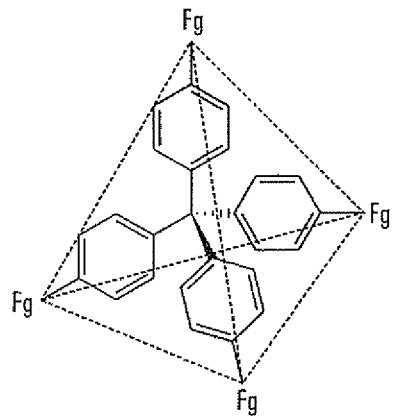
Figure 1J:
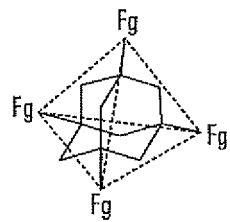
Figure 1K:
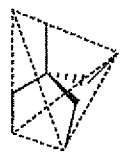
Figure 1L:
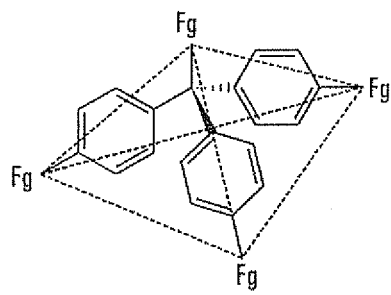
Figure 1M:
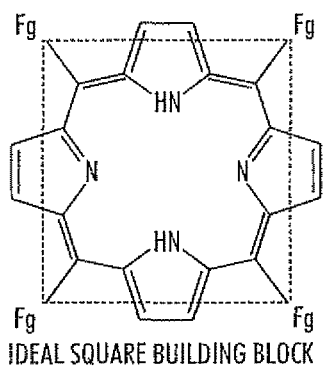
Figure 1N:
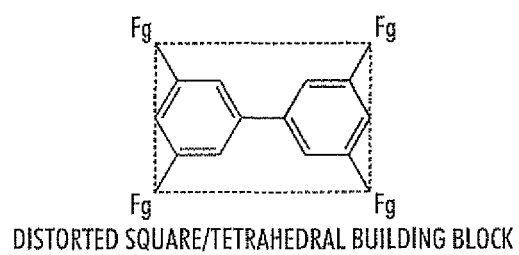

In this specification and the claims that follow, singular forms such as "a," "an," and "the" include plural forms unless the content clearly dictates otherwise.

The term "SOF" generally refers to a covalent organic framework (COF) that is a film at a macroscopic level. The phrase "macroscopic level" refers, for example, to the naked eye view of the present SOFs. Although. COFs are a network at the "microscopic level" or "molecular level" (requiring use of powerful magnifying equipment or as assessed using scattering methods), the present SOF is fundamentally different at the "macroscopic level" because the film is for instance orders of magnitude larger in coverage than a microscopic level COF network. SOFs described herein that may be used in the embodiments described herein are high mobility SOFs and have macroscopic morphologies much different than typical COFs previously synthesized.

For robust networked organic materials, high mobility is difficult to achieve. The term "high mobility SOF" refers, for example, to a SOF possessing long-range molecular order (periodic) and consequent exceptional (hole/electron) mobilities, which possess mobility substantially equal to or greater than the mobility of known nominal organic electronic materials. In the present disclosure, a "high mobility" SOF may have a mobility of greater than about $0.1\ cm^2/Vs$, such as a mobility ranging from about 0.1 to about $3.0\ cm^2/Vs$, or from about 0.2 to about $2\ cm^2/Vs$, or from about 0.5 to about $1.5\ cm^2/Vs$. It is known that high charge mobility relates to electronic structure of the material at the atomic level. Such electronic structure may be referred to as 'band structure,' which is an established representation of electronic energy levels within a material. Materials that are identified as comprising a Fermi Level that lies within a band possess a unique ability to transport charge.

In embodiments, the SOF may be a composite SOF. In such an SOF, a portion or region of the SOF may be a composite SOF, while a different portion or region of the SOF, which may or may not be adjacent to the composite SOF, is another type of SOF, such as a periodic SOF. Such composite SOF compositions may alter the properties of SOFs without changing constituent building blocks. For example, the mechanical and physical properties of the SOF. Optionally, a capping unit may be introduced into a portion or region of the SOF that is not periodic, so that the SOF framework is locally 'interrupted' where the capping units are present.

The SOFs, such as periodic SOFs (which may or may not comprise a composite and/or capped SOF portion or region), of the present disclosure may be at the macroscopic level substantially pinhole-free SOFs or pinhole-free SOFs having continuous covalent organic frameworks that can extend over larger length scales such as for instance much greater than a millimeter to lengths such as a meter and, in theory, as much as hundreds of meters. It will also be appreciated that SOFs tend to have large aspect ratios where typically two dimensions of a SOF will be much larger than the third. SOFs have markedly fewer macroscopic edges and disconnected external surfaces than a collection of COF particles.

Additionally, when a capping unit is introduced into a portion or region of the SOF that is not periodic, the SOF framework is locally 'interrupted' where the capping units are present. These SOF compositions are 'covalently doped' because a foreign molecule is bonded to the SOF framework when capping units are present. Capped SOF compositions may alter the properties of SOFs without changing constituent building blocks. For example, the mechanical and physical properties of the portion of the SOF that comprises a capped SOF (where the SOF framework is interrupted) may differ from a portion or region of the same SOF that is an uncapped SOF, such as a portion or region of the SOF that is periodic.

The SOFs of the present disclosure may be, at the macroscopic level, substantially pinhole-free SOFs or pinhole-free SOFs having continuous covalent organic frameworks that can extend over larger length scales such as for instance much greater than a millimeter to lengths such as a meter and, in theory, as much as hundreds of meters. It will also be appreciated that SOFs tend to have large aspect ratios where typically two dimensions of a SOF will be much larger than the third. SOFs have markedly fewer macroscopic edges and disconnected external surfaces than a collection of COF particles.

In embodiments, a "substantially pinhole-free SOF" or "pinhole-free SOF" may be formed from a reaction mixture deposited on the surface of an underlying substrate. The term "substantially pinhole-free SOF" refers, for example, to an SOF that may or may not be removed from the underlying substrate on which it was formed and contains substantially no pinholes, pores or gaps greater than the distance between the cores of two adjacent segments per square cm; such as, for example, less than 10 pinholes, pores or gaps greater than about 250 nanometers in diameter per $cm^2$, or less than 5 pinholes, pores or gaps greater than about 100 nanometers in diameter per $cm^2$. The term "pinhole-free SOF" refers, for example, to an SOF that may or may not be removed from the underlying substrate on which it was formed and contains no pinholes, pores or gaps greater than the distance between the cores of two adjacent segments per $micron^2$, such as no pinholes, pores or gaps greater than about 500 Angstroms in diameter per $micron^2$, or no pinholes, pores or gaps greater than about 250 Angstroms in diameter per $micron^2$, or no pinholes, pores or gaps greater than about 100 Angstroms in diameter per $micron^2$.

Molecular Building Block

The SOFs of the present disclosure comprise molecular building blocks having a segment (S) and functional groups (Fg). Molecular building blocks require at least two functional groups ($x \geq 2$) and may comprise a single type or two or more types of functional groups. Functional groups are the reactive chemical moieties of molecular building blocks that participate in a chemical reaction to link together segments during the SOF forming process. A segment is the portion of the molecular building block that supports functional groups and comprises all atoms that are not associated with functional groups. Further, the composition of a molecular building block segment remains unchanged after SOF formation.

Functional Group

Functional groups are the reactive chemical moieties of molecular building blocks that participate in a chemical reaction to link together segments during the SOF forming process. Functional groups may be composed of a single atom, or functional groups may be composed of more than one atom. The atomic compositions of functional groups are those compositions normally associated with reactive moieties in chemical compounds. Non-limiting examples of functional groups include halogens, alcohols, ethers, ketones, carboxylic acids, esters, carbonates, amines, amides, imines, ureas, aldehydes, isocyanates, tosylates, alkenes, alkynes and the like.

Molecular building blocks contain a plurality of chemical moieties, but only a subset of these chemical moieties are intended to be functional groups during the SOF forming process. Whether or not a chemical moiety is considered a functional group depends on the reaction conditions selected for the SOF forming process. Functional groups (Fg) denote a chemical moiety that is a reactive moiety, that is, a functional group during the SOF forming process.

In the SOF forming process the composition of a functional group will be altered through the loss of atoms, the gain of atoms, or both the loss and the gain of atoms; or, the functional group may be lost altogether. In the SOF, atoms previously associated with functional groups become associated with linker groups, which are the chemical moieties that join together segments. Functional groups have characteristic chemistries and those of ordinary skill in the art can generally recognize in the present molecular building blocks the atom(s) that constitute functional group(s). It should be noted that an atom or grouping of atoms that are identified as part of the molecular building block functional group may be preserved in the linker group of the SOF.

Capping Unit

Capping units of the present disclosure are molecules that 'interrupt' the regular network of covalently bonded building blocks normally present in an SOF. The capped regions of the SOF compositions of the present disclosure are tunable in that the properties of the capped regions may be varied through the type and amount of capping unit introduced into the region of the SOF that is not periodic. Capping units may comprise a single type or two or more types of functional groups and/or chemical moieties.

Segment

A segment is the portion of the molecular building block that supports functional groups and comprises all atoms that are not associated with functional groups. Further, the composition of a molecular building block segment remains unchanged after SOF formation. In embodiments, the SOF may contain a first segment having a structure the same as or different from a second segment. In other embodiments, the structures of the first and/or second segments may be the same as or different from a third segment, forth segment, fifth segment, etc. A segment is also the portion of the molecular building block that can provide an inclined property. Inclined properties are described later in the embodiments.

A description of various exemplary molecular building blocks, linkers, SOF types, strategies to synthesize a specific SOF type with exemplary chemical structures, building blocks whose symmetrical elements are outlined, and classes of exemplary molecular entities and examples of members of each class that may serve as molecular building blocks for SOFs are detailed in U.S. patent application Ser. Nos. 12/716,524; 12/716,449; 12/716,706; 12/716,324; 12/716,686; 12/716,571; 12/815,688; 12/845,053; 12/845,235; 12/854,962; 12/854,957; and 12/845,052 entitled "Structured Organic Films," "Structured Organic Films Having an Added Functionality," "Mixed Solvent Process for Preparing Structured Organic Films," "Composite Structured Organic Films," "Process For Preparing Structured Organic Films (SOFs) Via a Pre-SOF," "Electronic Devices Comprising Structured Organic Films," "Periodic Structured Organic Films," "Capped Structured Organic Film Compositions," "Imaging Members Comprising Capped Structured Organic Film Compositions," "Imaging Members for Ink-Based Digital Printing Comprising Structured Organic Films," "Imaging Devices Comprising Structured Organic Films," and "Imaging Members Comprising Structured Organic Films," respectively; and U.S. Provisional Application No. 61/157,411, entitled "Structured Organic Films" filed Mar. 4, 2009, the disclosures of which are totally incorporated herein by reference in their entireties.

In embodiments, a computer simulation or materials modeling of a SOF composition may be used to select a desired structure of an SOF with desired or predetermined properties. For example, a computer simulation or materials modeling of a specific SOF composition may be used to select a desired SOF that should conduct electrons. Other non-limiting examples of properties that can be extracted from computer simulation are optical properties, mechanical properties, atomic-level structural parameters, diffusion properties, and porous properties. In embodiments, a metric of the computer simulation or materials modeling may be used to select a specific SOF composition with desired properties. In embodiments, a metric of the computer simulation may include parameters such as, for example, the degree of expected molecular orbital overlap, expected extent of uniformity regarding the spacial orientation of the building blocks, the band structure, atomic-level stresses, geometry optimization, and X-ray (or other) scattering patterns, among others.

The modeling of SOF structures is facilitated by the modular nature (i.e. reticular chemistry) of their composition. In the art of reticular chemistry, molecular building blocks may be regarded as geometric shapes and consequently the assembly of these 'molecular shapes' falls into a number of predetermined arrangements following reaction of molecular building blocks (the SOF forming reaction). A number of parameters may be computed and subsequently examined during and following computer simulation of SOF structures to assess properties of a particular SOF structure.

Exemplary methods to extract properties from computer simulated SOF structures may include, for example, calculating the band structure of the SOF. In embodiments, such a calculation may be employed such that optical and electrical properties may be predicted by noting the position of the Fermi level and the magnitude and position of the band gap.

In embodiments, methods to extract properties from computer simulated. SOF structures may include information and/or parameters regarding mechanical properties, which may, for example, be estimated by monitoring the atomic-level stresses on the SOF under sheer. In embodiments, methods to extract properties from computer simulated SOF structures may include information and/or parameters regarding structural metrics, which may, for example, be computed at the atomic level following geometry optimization calculations. In embodiments, methods to extract properties from computer simulated SOF structures may include information and/or parameters regarding bulk structural features, which may, for example, be simulated by calculating the X-ray (or other) scattering pattern of the material. In embodiments, methods to extract properties from computer simulated SOF structures may include information and/or parameters regarding diffusion properties, which may, for example, be assessed using molecular dynamics methods and subsequently calculating the population gradient across the SOF structure. In embodiments, porosity (surface area) may be assessed using the Connoly method.

In embodiments, a computer simulation or materials modeling of a specific SOF composition may be used to select specific molecular building blocks, linkers and SOF type such that the spacial orientation between linked molecular building blocks is uniform. In embodiments, reaction components (such as molecular building blocks, etc.,) identified by the computer simulation or materials modeling are used to produce a SOF, such as a periodic SOF. For example, the reaction conditions may be tuned so the spacial orientation between the formed linked molecular building blocks is uniform throughout the entire SOF, such that an SOF having a periodic structure is formed. In embodiments, the reaction components are selected by reverse synthesis of the linked molecular building blocks identified by the computer simulation or materials modeling.

In embodiments, reaction components (such as molecular building blocks, etc.,) identified as a result of the computer simulation or materials modeling are used to produce an SOF by tuning the reaction conditions of the process to produce the SOF so the spacial orientation between linked molecular building blocks is uniform throughout a portion or region of the SOF such that an SOF having a periodic portion or region is formed.

In embodiments, the linked molecular building blocks may be selected such that there may be a high degree of molecular orbital overlap between molecular building blocks throughout the entire SOF. In embodiments, a computer simulation or materials modeling may be used to identify linked molecular building blocks that have a high degree of molecular orbital overlap between molecular building blocks throughout the entire SOF. In embodiments, the molecular building blocks, linkers and SOF type may be selected to allow for the production of efficient conduction pathways for electrons/holes. In embodiments, a computer simulation or materials modeling may be used to molecular building blocks, linkers and SOF type that allow for the production of efficient conduction pathways for electrons/holes.

In embodiments, computer simulation or materials modeling may be used to formulate the molecular-level structure of the SOF, such as, for example, by estimating and/or maximizing the SOFs charge transport properties. In embodiments, the computer simulation or materials modeling results may be used to select specific molecular building blocks, linkers and SOF type that substantially replicates the modeled molecular-level structure of the SOF in at least a region of the SOF. As used herein, the term "substantially replicates" refers to an tangible reproduction of the simulated SOF that possesses the properties and characteristics of the simulated SOF, such as a dry SOF that possesses at least 80% of the predicted properties and characteristics of the simulated SOF (e.g., a dry SOF with a mobility, degree of expected molecular orbital overlap, expected extent of uniformity regarding the spacial orientation of the building blocks, the band structure, or atomic-level stress (as well as other properties and characteristics) that is predicted for the simulated SOF) that is at least 80% of the mobility, degree of expected molecular orbital overlap, expected extent of uniformity regarding the spacial orientation of the building blocks, the band structure, or atomic-level stress (as well as other properties and characteristics) that is predicted for the simulated SOF), or a dry SOF that possesses at least 90% of the predicted properties and characteristics of the simulated. SOF, or a dry SOF that possesses at least 95% of the predicted the properties and characteristics of the simulated SOF, a dry SOF that possesses at least 95% of the predicted the properties and characteristics of the simulated SOF.

In embodiments, the selected reaction components (such as molecular building blocks, linkers, etc.,) identified as a result of the computer simulation or materials modeling are reacted to produce an SOF. In embodiments, the reaction components (such as molecular building blocks, linkers, etc.,) identified as a result of the computer simulation or materials modeling may be reacted under conditions necessary in order to replicate the modeled molecular-level structure of the SOF in at least a predetermined region of the SOF.

In embodiments, computer simulation or materials modeling may employ density functional theory and quantum chemical calculations to calculate a preselected property or metric of the SOF. For example, computer simulation or materials modeling may employ density functional theory and quantum chemical calculations to generate a density of states diagram (i.e. molecular orbital diagram for an extended solid) for the material and calculate the Fermi energy level. A general discussion regarding how to generate a density of states diagram and how the fermi level would be calculated may be found in the following references (the disclosures of which are hereby incorporated by reference in their entireties: Perdew, J. P.; Wang, Y. Phys. Rev. B., 33, 8800 (1986); Density Functional Theory: A Tool for Chemistry, Politzer, P.; Seminario, J. M., Eds., Elsevier: Amsterdam (1995), and references therein; Bradley, C. R.; Cracknell, A. P. *The Mathematical Theory of Symmetry in Solids*, Clarendon Press: Oxford (1972);

S. J. Clark, M. D. Segall, C. J. Pickard, P. J. Hasnip, M. J. Probert, K. Refson, M. C. Payne *Zeitschrift für Kristallographie* 220 (5-6) pp. 567-570 (2005); and M. C. Payne, M. P. Teter and D. C. Allan, T. A. Arias, and J. D. Joannopoulos, Rev. Mod. Phys. 64, 1045-4097 (1992).

In embodiments, computer simulation or materials modeling may employ density functional theory and quantum chemical calculations to predict high mobility by assessing putative SOF structures for the location of their Fermi Levels in relation to its band structure. For example, in the methods of the present disclosure, computer simulation or materials modeling may be used to identify materials (such as, for example, high mobility SOF materials) whose Fermi Level resides within a band and thus possess a unique ability to transport charge.

In embodiments, computer simulation or materials modeling may include an ab initio method designed to select specific molecular building blocks, linkers and SOF type and formulate the molecular-level structure of the SOF. In an ab initio method, the energy of the molecule and all of its derivative values depend on the determination of the wavefunction. The problem is that the wavefunction is not a physical observable; that is, the wavefunction is purely a mathematical construct. In reality, the wavefunction is simply a statistical probability that the electron(s) will be at a specific place or part of the molecule (such as an SOF). Even though the wavefunction does not exist as a physical, observable property of an atom or molecule, the mathematical determination of the wavefunction (and with it, the atomic and molecular orbitals) may be a good predictor of various properties of the molecule, and in the case of extended systems, a good predictor of bulk electronic structure.

In embodiments, computer simulation or materials modeling may include a computational method based on Density Functional Theory. Density Functional Theory (DFT) is a computational method that derives properties of the molecule or collection of molecules based on a determination of the electron density of the molecule. Unlike the wavefunction, which is not a physical reality but a mathematical construct, electron density is a physical characteristic of all molecules. A functional is defined as a function of a function, and the energy of the molecule is a functional of the electron density. The electron density is a function with three variables—x-, y-, and z-position of the electrons. Unlike the wavefunction, which becomes significantly more complicated as the number of electrons increases, the determination of the electron density is independent of the number of electrons.

Suitable types, or categories, of DFT computational methods that may be used in the methods of the present disclosure include Local Density Approximation (LDA) methods, Gradient-Corrected (GC) methods, Hybrid methods, and the like. Local density approximation (LDA) methods assume that the density of the molecule is uniform throughout the molecule. Gradient-corrected (GC) methods look to account for the non-uniformity of the electron density. Hybrid methods, as the name suggests, attempt to incorporate some of the more useful features from ab initio methods (specifically Hartree-Fock methods) with some of the improvements of DFT mathematics.

In embodiments, the specific molecular building blocks, linkers and SOF type Periodic SOFs are selected by computer-aided design where charge transport properties can be estimated using materials modeling software. For example, DFT methods are now standard in various software packages, including Gaussian, GAMESS, HyperChem, and Spartan, and Materials Studio. In addition, the user may customize a calculation to include advanced DFT methods. In embodiments, such software packages may include Materials Studio.

The Dmol3 module of Materials Studio was employed for the present invention. This module houses a suite of DFT-based tools for calculating various properties of materials including electronic structure. In the case of SOF systems a gradient correction method was using Perdew-Burke-Ernzerhof correlation (PBE; Perdew, S. P.; Burke, K.; Ernzerhof, M. Phys. Rev. Lett., 77, 3865 (1996)), double numerical including d-funtions (DND) basis set, solving for 1×1×1 k-point set.

Metrical Parameters of SOFs

SOFs have any suitable aspect ratio. In embodiments, SOFs have aspect ratios for instance greater than about 30:1 or greater than about 50:1, or greater than about 70:1, or greater than about 100:1, such as about 1000:1. The aspect ratio of a SOF is defined as the ratio of its average width or diameter (that is, the dimension next largest to its thickness) to its average thickness (that is, its shortest dimension). The term 'aspect ratio,' as used here, is not bound by theory. The longest dimension of a SOF is its length and it is not considered in the calculation of SOF aspect ratio.

Generally, SOFs have widths and lengths, or diameters greater than about 500 micrometers, such as about 10 mm, or 30 mm. The SOFs have the following illustrative thicknesses: about 10 Angstroms to about 250 Angstroms, such as about 20 Angstroms to about 200 Angstroms, for a mono-segment thick layer and about 20 nm to about 5 mm, about 50 nm to about 10 mm for a multi-segment thick layer.

SOF dimensions may be measured using a variety of tools and methods. For a dimension about 1 micrometer or less, scanning electron microscopy is the preferred method. For a dimension about 1 micrometer or greater, a micrometer (or ruler) is the preferred method.

Multilayer SOFs

A SOF may comprise a single layer or a plurality of layers (that is, two, three or more layers) where the individual layers may be the same or different types of SOFs, such as a periodic SOF, composite SOF, capped SOF, and/or combinations thereof. SOFs that are comprised of a plurality of layers may be physically joined (e.g., dipole and hydrogen bond) or chemically joined. Physically attached layers are characterized by weaker interlayer interactions or adhesion; therefore physically attached layers may be susceptible to delamination from each other. Chemically attached layers are expected to have chemical bonds (e.g., covalent or ionic bonds) or have numerous physical or intermolecular (supramolecular) entanglements that strongly link adjacent layers.

Therefore, delamination of chemically attached layers is much more difficult. Chemical attachments between layers may be detected using spectroscopic methods such as focusing infrared or Raman spectroscopy, or with other methods having spatial resolution that can detect chemical species precisely at interfaces. In cases where chemical attachments between layers are different chemical species than those within the layers themselves it is possible to detect these attachments with sensitive bulk analyses such as solid-state nuclear magnetic resonance spectroscopy or by using other bulk analytical methods.

In the embodiments, the SOF may be a single layer (mono-segment thick or multi-segment thick) or multiple layers (each layer being mono-segment thick or multi-segment thick). "Thickness" refers, for example, to the smallest dimension of the film. As discussed above, in a SOF, segments are molecular units that are covalently bonded through linkers to generate the molecular framework of the film. The thickness of the film may also be defined in terms of the number of segments that is counted along that axis of the film when viewing the cross-section of the film. A "monolayer" SOF is the simplest case and refers, for example, to where a film is one segment thick. A SOF where two or more segments exist along this axis is referred to as a "multi-segment" thick SOF.

An exemplary method for preparing physically attached multilayer SOFs includes: (1) forming a base SOF layer that may be cured by a first curing cycle, and (2) forming upon the base layer a second reactive wet layer followed by a second curing cycle and, if desired, repeating the second step to form a third layer, a forth layer and so on. The physically stacked multilayer SOFs may have thicknesses greater than about 20 Angstroms such as, for example, the following illustrative thicknesses: about 20 Angstroms to about 10 cm, such as about 1 nm to about 10 mm, or about 0.1 mm Angstroms to about 5 mm. In principle there is no limit with this process to the number of layers that may be physically stacked.

In embodiments, a multilayer SOF is formed by a method for preparing chemically attached multilayer SOFs by: (1) forming a base SOF layer having functional groups present on the surface (or dangling functional groups) from a first reactive wet layer, and (2) forming upon the base layer a second SOF layer from a second reactive wet layer that comprises molecular building blocks with functional groups capable of reacting with the dangling functional groups on the surface of the base SOF layer. In further embodiments, a capped SOF may serve as the base layer in which the functional groups present that were not suitable or complementary to participate in the specific chemical reaction to link together segments during the base layer SOF forming process may be available for reacting with the molecular building blocks of the second layer to from an chemically bonded multilayer SOF. If desired, the formulation used to form the second SOF layer should comprise molecular building blocks with functional groups capable of reacting with the functional groups from the base layer as well as additional functional groups that will allow for a third layer to be chemically attached to the second layer. The chemically stacked multilayer SOFs may have thicknesses greater than about 20 Angstroms such as, for example, the following illustrative thicknesses: about 20 Angstroms to about 10 cm, such as about 1 nm to about 10 mm, or about 0.1 mm Angstroms to about 5 mm. In principle there is no limit with this process to the number of layers that may be chemically stacked.

In embodiments, the method for preparing chemically attached multilayer SOFs comprises promoting chemical attachment of a second SOF onto an existing SOF (base layer) by using a small excess of one molecular building block (when more than one molecular building block is present) during the process used to form the SOF (base layer) whereby the functional groups present on this molecular building block will be present on the base layer surface. The surface of base layer may be treated with an agent to enhance the reactivity of the functional groups or to create an increased number of functional groups.

In an embodiment the dangling functional groups or chemical moieties present on the surface of an SOF or capped SOF may be altered to increase the propensity for covalent attachment (or, alternatively, to disfavor covalent attachment) of particular classes of molecules or individual molecules, such as SOFs, to a base layer or any additional substrate or SOF layer. For example, the surface of a base layer, such as an SOF layer, which may contain reactive dangling functional groups, may be rendered pacified through surface treatment with a capping chemical, group. For example, a SOF layer having dangling hydroxyl alcohol groups may be pacified by treatment with trimethylsiylchloride thereby capping hydroxyl groups as stable trimethylsilylethers. Alternatively, the surface of base layer may be treated with a non-chemically bonding agent, such as a wax, to block reaction with dangling functional groups from subsequent layers.

Molecular Building Block Symmetry

Molecular building block symmetry relates to the positioning of functional groups (Fgs) around the periphery of the molecular building block segments. Without being bound by chemical or mathematical theory, a symmetric molecular building block is one where positioning of Fgs may be associated with the ends of a rod, vertexes of a regular geometric shape, or the vertexes of a distorted rod or distorted geometric shape. For example, the most symmetric option for molecular building blocks containing four Fgs are those whose Fgs overlay with the corners of a square or the apexes of a tetrahedron.

Use of symmetrical building blocks is practiced in embodiments of the present disclosure for two reasons: (1) the patterning of molecular building blocks may be better anticipated because the linking of regular shapes is a better understood process in reticular chemistry, and (2) the complete reaction between molecular building blocks is facilitated because for less symmetric building blocks errant conformations/orientations may be adopted which can possibly initiate numerous linking defects within SOFs.

Figure 1O:
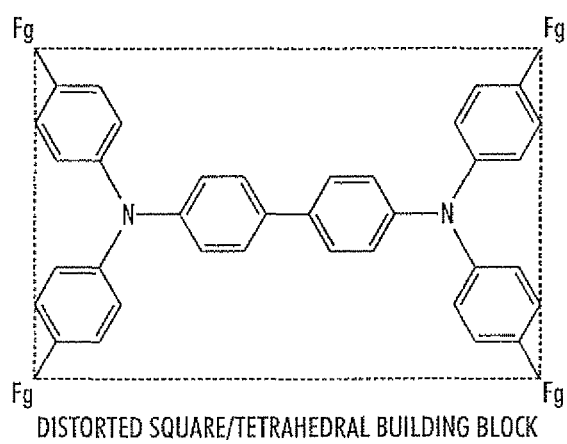

FIGS. 1A-O illustrate exemplary building blocks whose symmetrical elements are outlined. Such symmetrical elements are found in building blocks that may be used in the present disclosure.

Non-limiting examples of various classes of exemplary molecular entities that may serve as molecular building blocks for SOFs of the present disclosure include building blocks containing a carbon or silicon atomic core; building blocks containing alkoxy cores; building blocks containing a nitrogen or phosphorous atomic core; building blocks containing aryl cores; building blocks containing carbonate cores; building blocks containing carbocyclic-, carbobicyclic-, or carbotricyclic core; and building blocks containing an oligothiophene core.

In embodiments, a Type 1 SOF contains segments, which are not located at the edges of the SOF, that are connected by linkers to at least three other segments. For example, in embodiments the SOF comprises at least one symmetrical building block selected from the group consisting of ideal triangular building blocks, distorted triangular building blocks, ideal tetrahedral building blocks, distorted tetrahedral building blocks, ideal square building blocks, and distorted square building blocks. In embodiments, Type 2 and 3 SOF contains at least one segment type, which are not located at the edges of the SOF, that are connected by linkers to at least three other segments. For example, in embodiments the SOF comprises at least one symmetrical building block selected from the group consisting of ideal triangular building blocks, distorted triangular building blocks, ideal tetrahedral building blocks, distorted tetrahedral building blocks, ideal square building blocks, and distorted square building blocks.

Practice of Linking Chemistry

In embodiments linking chemistry may occur wherein the reaction between functional groups produces a volatile byproduct that may be largely evaporated or expunged from the SOF during or after the film forming process or wherein no byproduct is formed. Linking chemistry may be selected to achieve a SOF for applications where the presence of linking chemistry byproducts is not desired. Linking chemistry reactions may include, for example, condensation, addition/elimination, and addition reactions, such as, for example, those that produce esters, imines, ethers, carbonates, urethanes, amides, acetals, and silyl ethers.

In embodiments the linking chemistry via a reaction between function groups producing a non-volatile byproduct that largely remains incorporated within the SOF after the film forming process. Linking chemistry in embodiments may be selected to achieve a SOF for applications where the presence of linking chemistry byproducts does not impact the properties or for applications where the presence of linking chemistry byproducts may alter the properties of a SOF (such as, for example, the electroactive, hydrophobic or hydrophilic nature of the SOF). Linking chemistry reactions may include, for example, substitution, metathesis, and metal catalyzed coupling reactions, such as those that produce carbon-carbon bonds.

For all linking chemistry the ability to control the rate and extent of reaction between building blocks via the chemistry between building block functional groups is an important aspect of the present disclosure. Reasons for controlling the rate and extent of reaction may include adapting the film forming process for different coating methods and tuning the microscopic arrangement of building blocks to achieve a periodic SOF, as defined in earlier embodiments.

Innate Properties of COFs

COFs have innate properties such as high thermal stability (typically higher than 400° C. under atmospheric conditions); poor solubility in organic solvents (chemical stability), and porosity (capable of reversible guest uptake). In embodiments, SOFs may also possess these innate properties.

Added Functionality of SOFs

Added functionality denotes a property that is not inherent to conventional COFs and may occur by the selection of molecular building blocks wherein the molecular compositions provide the added functionality in the resultant SOF. Added functionality may arise upon assembly of molecular building blocks having an "inclined property" for that added functionality. Added functionality may also arise upon assembly of molecular building blocks having no "inclined property" for that added functionality but the resulting SOF has the added functionality as a consequence of linking segments (S) and linkers into a SOF. Furthermore, emergence of added functionality may arise from the combined effect of using molecular building blocks bearing an "inclined property" for that added functionality whose inclined property is modified or enhanced upon linking together the segments and linkers into a SOF.

An Inclined Property of a Molecular Building Block

The term "inclined property" of a molecular building block refers, for example, to a property known to exist for certain molecular compositions or a property that is reasonably identifiable by a person skilled in art upon inspection of the molecular composition of a segment. As used herein, the terms "inclined property" and "added functionality" refer to the same general property (e.g., hydrophobic, electroactive, etc.) but "inclined property" is used in the context of the molecular building block and "added functionality" is used in the context of the SOF.

The hydrophobic (superhydrophobic), hydrophilic, lipophobic (superlipophobic), lipophilic, photochromic and/or electroactive (conductor, semiconductor, charge transport material) nature of an SOF are some examples of the properties that may represent an "added functionality" of an SOF. These and other added functionalities may arise from the inclined properties of the molecular building blocks or may arise from building blocks that do not have the respective added functionality that is observed in the SOF.

The term hydrophobic (superhydrophobic) refers, for example, to the property of repelling water, or other polar species such as methanol, it also means an inability to absorb water and/or to swell as a result. Furthermore, hydrophobic implies an inability to form strong hydrogen bonds to water or other hydrogen bonding species. Hydrophobic materials are typically characterized by having water contact angles greater than 90° and superhydrophobic materials have water contact angles greater than 150° as measured using a contact angle goniometer or related device.

The term, hydrophilic refers, for example, to the property of attracting, adsorbing, or absorbing water or other polar species, or a surface that is easily wetted by such species. Hydrophilic materials are typically characterized by having less than 20° water contact angle as measured using a contact angle goniometer or related device. Hydrophilicity may also be characterized by swelling of a material by water or other polar species, or a material that can diffuse or transport water, or other polar species, through itself. Hydrophilicity, is further characterized by being able to form strong or numerous hydrogen bonds to water or other hydrogen bonding species.

The term lipophobic (oleophobic) refers, for example, to the property of repelling oil or other non-polar species such as alkanes, fats, and waxes. Lipophobic materials are typically characterized by having oil contact angles greater than 90° as measured using a contact angle goniometer or related device.

The term lipophilic (oleophilic) refers, for example, to the property attracting oil or other non-polar species such as alkanes, fats, and waxes or a surface that is easily wetted by such species. Lipophilic materials are typically characterized by having a low to nil oil contact angle as measured using, for example, a contact angle goniometer. Lipophilicity can also be characterized by swelling of a material by hexane or other non-polar liquids.

The term photochromic refers, for example, to the ability to demonstrate reversible color changes when exposed to electromagnetic radiation. SOF compositions containing photochromic molecules may be prepared and demonstrate reversible color changes when exposed to electromagnetic radiation. These SOFs may have the added functionality of photochromism. The robustness of photochromic SOFs may enable their use in many applications, such as photochromic SOFs for erasable paper, and light responsive films for window tinting/shading and eye wear. SOF compositions may contain any suitable photochromic molecule, such as a difunctional photochromic molecules as SOF molecular building blocks (chemically bound into SOF structure), a monofunctional photochromic molecules as SOF capping units (chemically bound into SOF structure, or unfunctionalized photochromic molecules in an SOF composite (not chemically bound into SOF structure). Photochromic SOFs may change color upon exposure to selected wavelengths of light and the color change may be reversible.

SOF compositions containing photochromic molecules that chemically bond to the SOF structure are exceptionally chemically and mechanically robust photochromic materials. Such photochromic SOF materials demonstrate many superior properties, such as high number of reversible color change processes, to available polymeric alternatives.

The term electroactive refers, for example, to the property to transport electrical charge (electrons and/or holes). Electroactive materials include conductors, semiconductors, and charge transport materials. Conductors are defined as materials that readily transport electrical charge in the presence of a potential difference. Semiconductors are defined as materials do not inherently conduct charge but may become conductive in the presence of a potential difference and an applied stimuli, such as, for example, an electric field, electromagnetic radiation, heat, and the like. Charge transport materials are defined as materials that can transport charge when charge is injected from another material such as, for example, a dye, pigment, or metal in the presence of a potential difference.

Conductors may be further defined as materials that give a signal using a potentiometer from about 0.1 to about $10^7$ S/cm.

Semiconductors may be further defined as materials that give a signal using a potentiometer from about $10^{-6}$ to about $10^4$ S/cm in the presence of applied stimuli such as, for example an electric field, electromagnetic radiation, heat, and the like. Alternatively, semiconductors may be defined as materials having electron and/or hole mobility measured using time-of-flight techniques in the range of $10^{-10}$ to about $10^6$ $cm^2V^{-1} s^{-1}$ when exposed to applied stimuli such as, for example an electric field, electromagnetic radiation, heat, and the like.

Charge transport materials may be further defined as materials that have electron and/or hole mobility measured using time-of-flight techniques in the range of $10^{-10}$ to about $10^6$ $cm^2V^{-1} s^{-1}$. It should be noted that under some circumstances charge transport materials may be also classified as semiconductors.

SOFs with hydrophobic added functionality may be prepared by using molecular building blocks with inclined hydrophobic properties and/or have a rough, textured, or porous surface on the sub-micron to micron scale. A paper describing materials having a rough, textured, or porous surface on the sub-micron to micron scale being hydrophobic was authored by Cassie and Baxter (Cassie, A. B. D.; Baxter, S. Trans. Faraday Soc., 1944, 40, 546).

Molecular building blocks comprising or bearing highly-fluorinated segments have inclined hydrophobic properties and may lead to SOFs with hydrophobic added functionality. Highly-fluorinated segments are defined as the number of fluorine atoms present on the segment(s) divided by the number of hydrogen atoms present on the segment(s) being greater than one. Fluorinated segments, which are not highly-fluorinated segments may also lead to SOFs with hydrophobic added functionality.

The above-mentioned fluorinated segments may include, for example, tetrafluorohydroquinone, perfluoroadipic acid hydrate, 4,4'-(hexafluoroisopropylidene)diphthalic anhydride, 4,4'-(hexafluoroisopropylidene)diphenol, and the like.

SOFs having a rough, textured, or porous surface on the sub-micron to micron scale may also be hydrophobic. The rough, textured, or porous SOF surface can result from dangling functional groups present on the film surface or from the structure of the SOF. The type of pattern and degree of patterning depends on the geometry of the molecular building blocks and the linking chemistry efficiency. The feature size that leads to surface roughness or texture is from about 100 nm to about 10 µm, such as from about 500 nm to about 5 µm.

SOFs with hydrophilic added functionality may be prepared by using molecular building blocks with inclined hydrophilic properties and/or comprising polar linking groups.

Molecular building blocks comprising segments bearing polar substituents have inclined hydrophilic properties and may lead to SOFs with hydrophilic added functionality. The term polar substituents refers, for example, to substituents that can form hydrogen bonds with water and include, for example, hydroxyl, amino, ammonium, and carbonyl (such as ketone, carboxylic acid, ester, amide, carbonate, urea).

SOFs with electroactive added functionality may be prepared by using molecular building blocks with inclined electroactive properties and/or be electroactive resulting from the assembly of conjugated segments and linkers. The following sections describe molecular building blocks with inclined hole transport properties, inclined electron transport properties, and inclined semiconductor properties.

SOFs with hole transport added functionality may be obtained by selecting segment cores such as, for example, triarylamines, hydrazones (U.S. Pat. No. 7,202,002 B2 to Tokarski et al.), and enamines (U.S. Pat. No. 7,416,824 B2 to Kondoh et al.) with the following general structures:

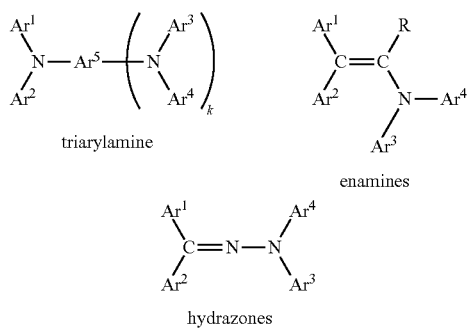

triarylamine enamines hydrazones

The segment core comprising a triarylamine being represented by the following general formula:

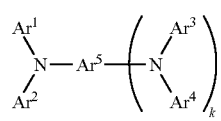

wherein $Ar^1$, $Ar^2$, $Ar^3$, $Ar^4$ and $Ar^5$ each independently represents a substituted or unsubstituted aryl group, or $Ar^5$ independently represents a substituted or unsubstituted arylene group, and k represents 0 or 1, wherein at least two of $Ar^1$, $Ar^2$, $Ar^3$, $Ar^4$ and $Ar^5$ comprises a Fg (previously defined). $Ar^5$ may be further defined as, for example, a substituted phenyl ring, substituted/unsubstituted phenylene, substituted/unsubstituted monovalently linked aromatic rings such as biphenyl, terphenyl, and the like, or substituted/unsubstituted fused aromatic rings such as naphthyl, anthranyl, phenanthryl, and the like.

Segment cores comprising arylamines with hole transport added functionality include, for example, aryl amines such as triphenylamine, N,N,N',N'-tetraphenyl-(1,1'-biphenyl)-4,4'-diamine, N,N'-diphenyl-N,N'-bis(3-methylphenyl)-(1,1'-bi-phenyl)-4,4'-diamine, N,N'-bis(4-butylphenyl)-N,N'-diphenyl-[p-terphenyl]-4,4''-diamine; hydrazones such as N-phenyl-N-methyl-3-(9-ethyl)carbazyl hydrazone and 4-diethyl amino benzaldehyde-1,2-diphenyl hydrazone; and oxadiazoles such as 2,5-bis(4-N,N'-diethylaminophenyl)-1,2,4-oxadiazole, stilbenes, and the like.

Molecular building blocks comprising triarylamine core segments with inclined hole transport properties may be derived from the list of chemical structures including, for example, those listed below:

triarylamine cores

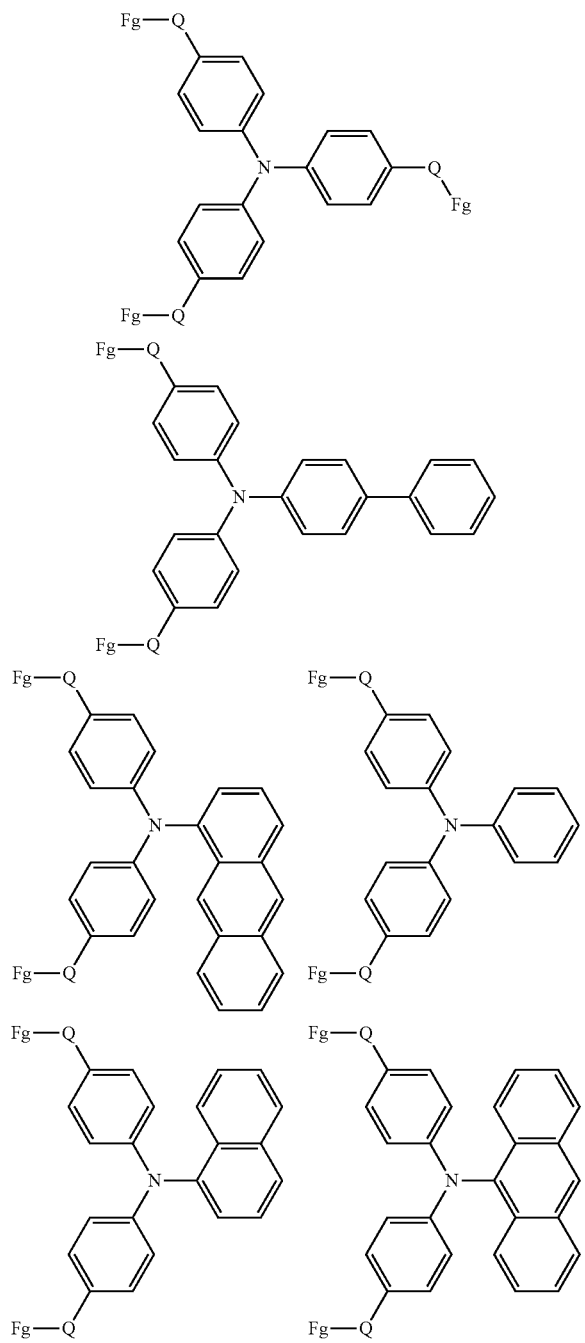

-continued

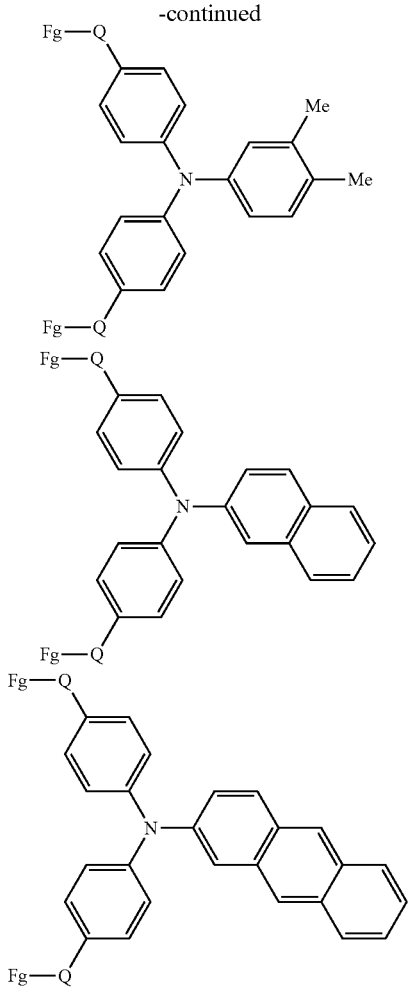

tetraarylbIphenylenediamine (TBD) cores

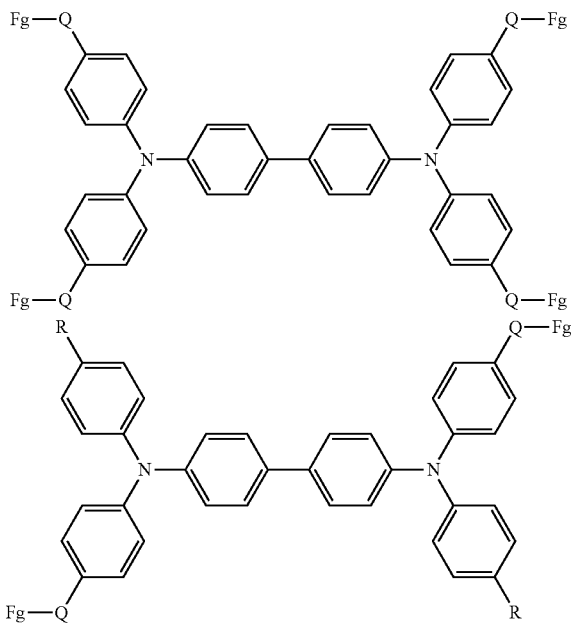

-continued
tetraarylterphenylenediamine (TER) cores

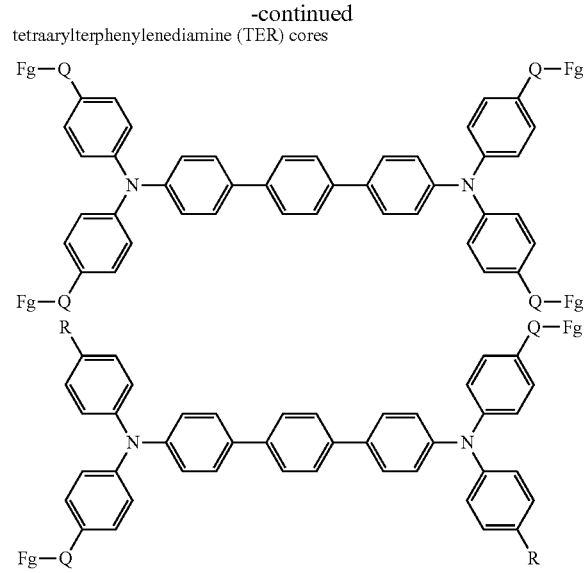

The segment core comprising a hydrazone being represented by the following general formula:

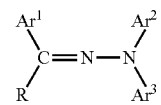

wherein $Ar^1$, $Ar^2$, and $Ar^3$ each independently represents an aryl group optionally containing one or more substituents, and R represents a hydrogen atom, an aryl group, or an alkyl group optionally containing a substituent; wherein at least two of $Ar^1$, $Ar^2$, and $Ar^3$ comprises a Fg (previously defined); and a related oxadiazole being represented by the following general formula:

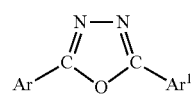

wherein Ar and $Ar^1$ each independently represent an aryl group that comprises a Fg (previously defined).

Molecular building blocks comprising hydrazone and oxadiazole core segments with inclined hole transport properties may be derived from the list of chemical structures including, for example, those listed below:

hydrazone cores

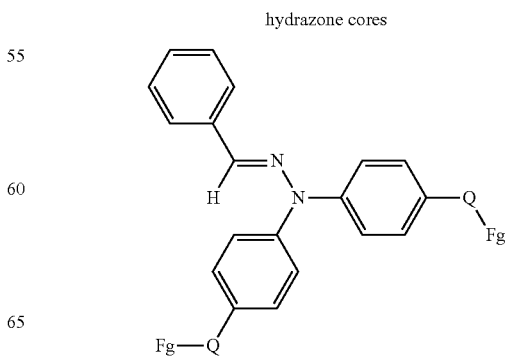

-continued

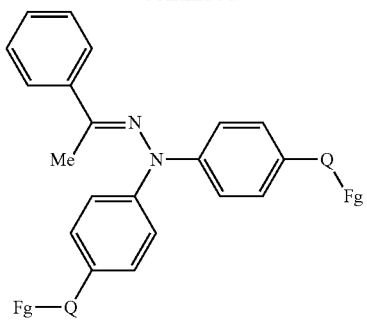

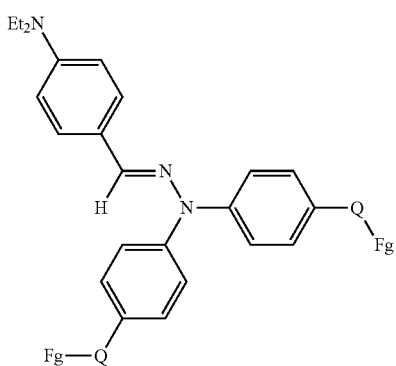

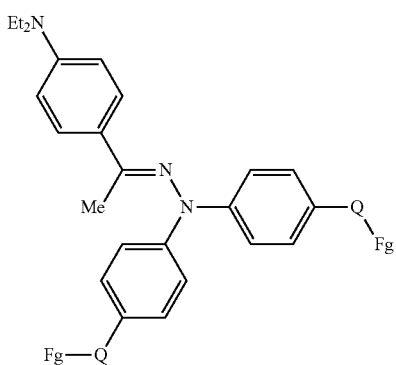

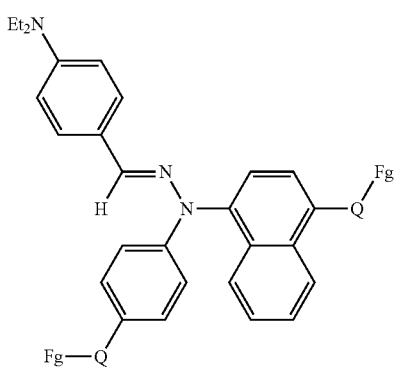

-continued

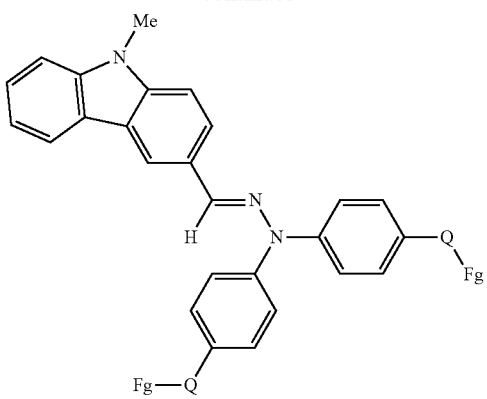

oxadiazole cores

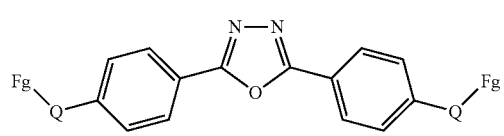

The segment core comprising an enamine being represented by the following general formula:

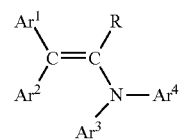

wherein $Ar^1$, $Ar^2$, $Ar^3$, and $Ar^4$ each independently represents an aryl group that optionally contains one or more substituents or a heterocyclic group that optionally contains one or more substituents, and R represents a hydrogen atom, an aryl group, or an alkyl group optionally containing a substituent; wherein at least two of $Ar^1$, $Ar^2$, $Ar^3$, and $Ar^4$ comprises a Fg (previously defined).

Molecular building blocks comprising enamine core segments with inclined hole transport properties may be derived from the list of chemical structures including, for example, those listed below:

enamine cores

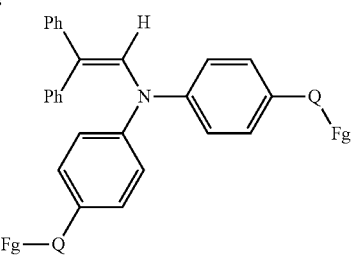

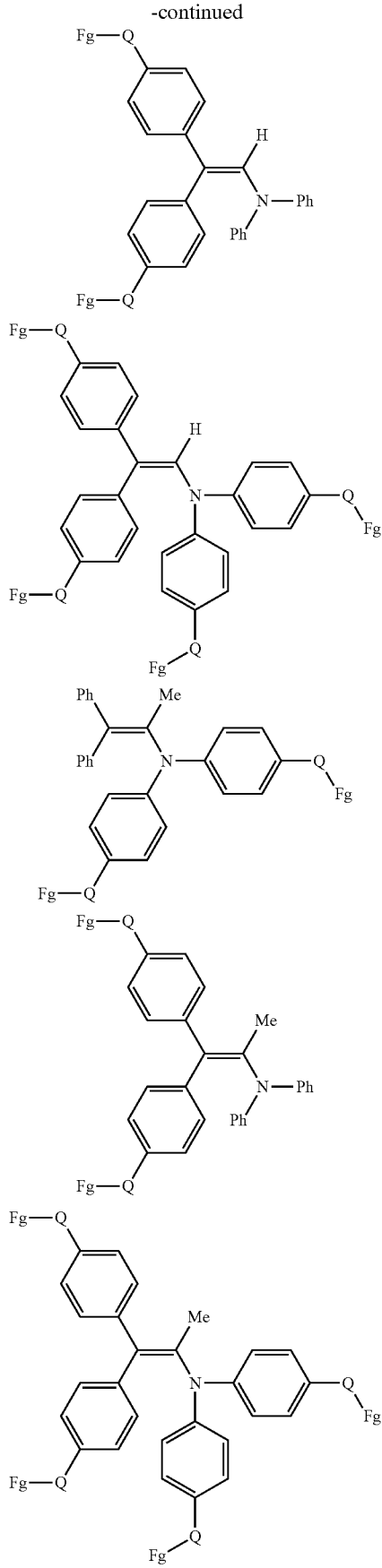
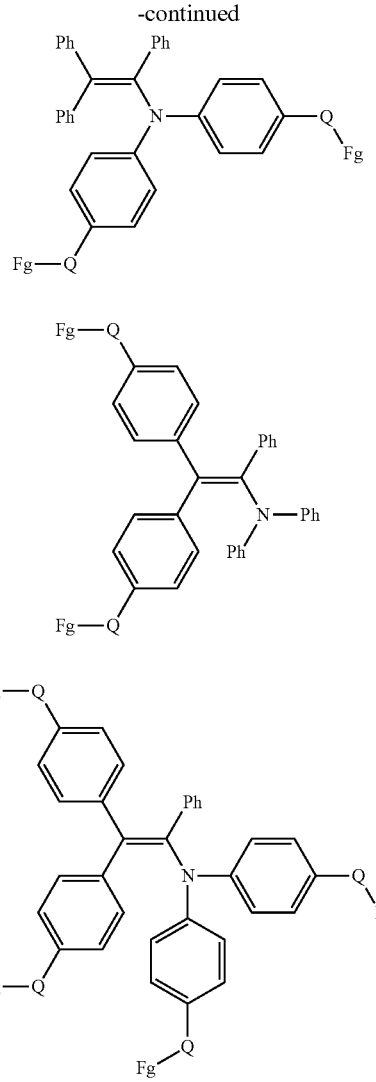
SOFs with electron transport added functionality may be obtained by selecting segment cores comprising, for example, nitrofluorenones, 9-fluorenylidene malonitriles, diphenoquinones, and naphthalenetetracarboxylic diimides with the following general structures:
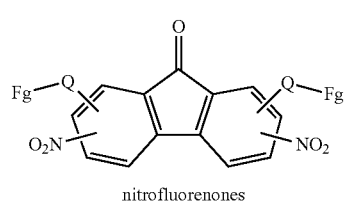
nitrofluorenones
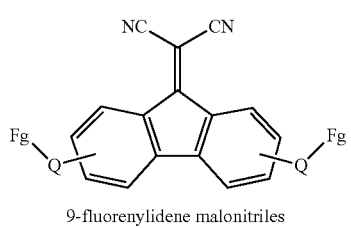
9-fluorenylidene malonitriles

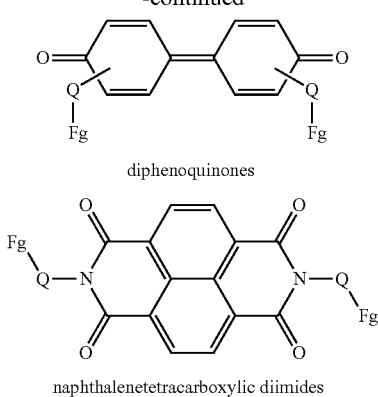

diphenoquinones naphthalenetetracarboxylic diimides

It should be noted that the carbonyl groups of diphenylquinones could also act as Fgs in the SOF forming process.

SOFs with semiconductor added functionality may be obtained by selecting segment cores such as, for example, acenes, thiophenes/oligothiophenes/fused thiophenes, perylene bisimides, or tetrathiofulvalenes, and derivatives thereof with the following general structures:

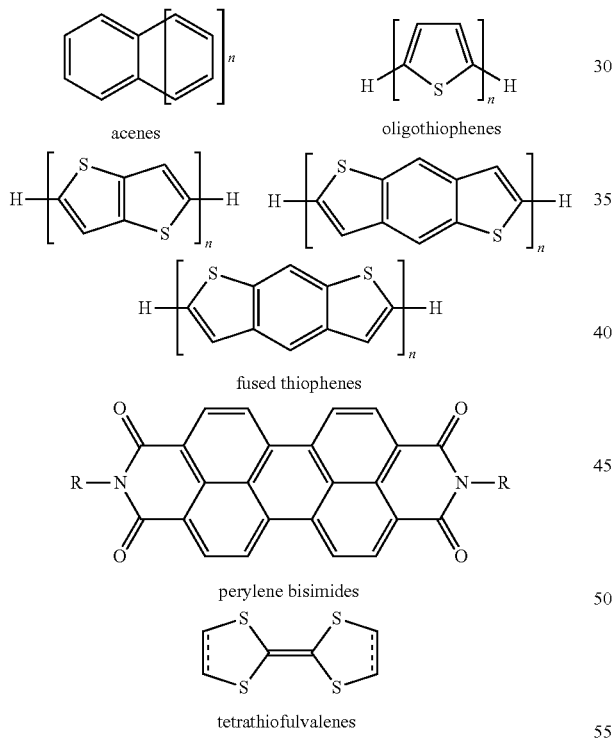

The SOF may be a p-type semiconductor, n-type semiconductor or ambipolar semiconductor. The SOF semiconductor type depends on the nature of the molecular building blocks. Molecular building blocks that possess an electron donating property such as alkyl, alkoxy, aryl, and amino groups, when present in the SOF, may render the SOF a p-type semiconductor. Alternatively, molecular building blocks that are electron withdrawing such as cyano, nitro, fluoro, fluorinated alkyl, and fluorinated aryl groups may render the SOF into the n-type semiconductor.

Molecular building blocks comprising acene core segments with inclined semiconductor properties may be derived from the list of chemical structures including, for example, those listed below:

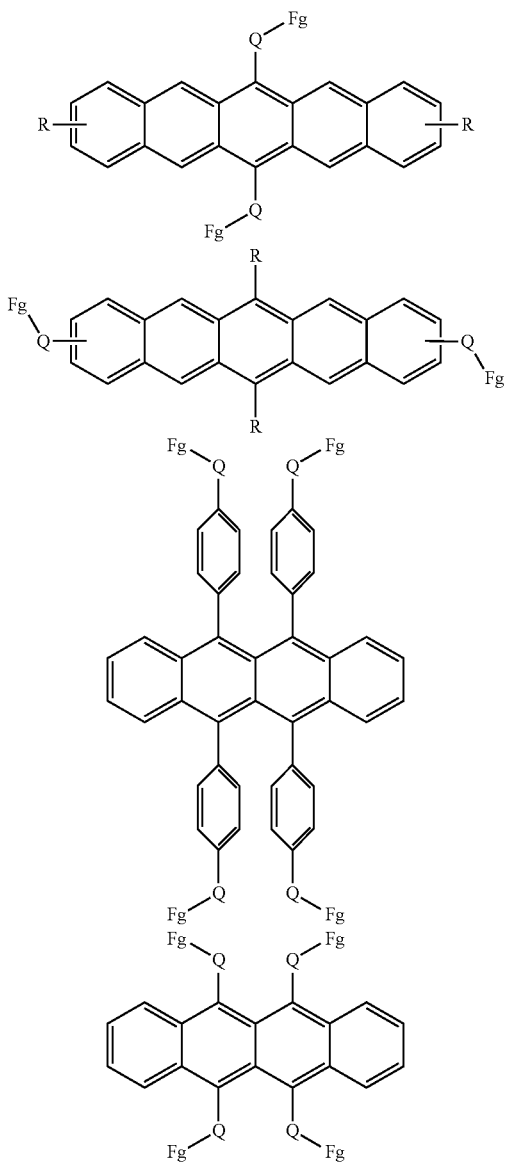

Molecular building blocks comprising thiophene/oligothiophene/fused thiophene core segments with inclined semiconductor properties may be derived from the list of chemical structures including, for example, those listed below:

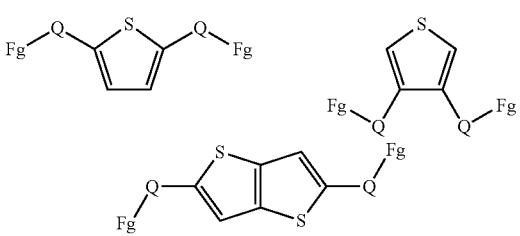

-continued

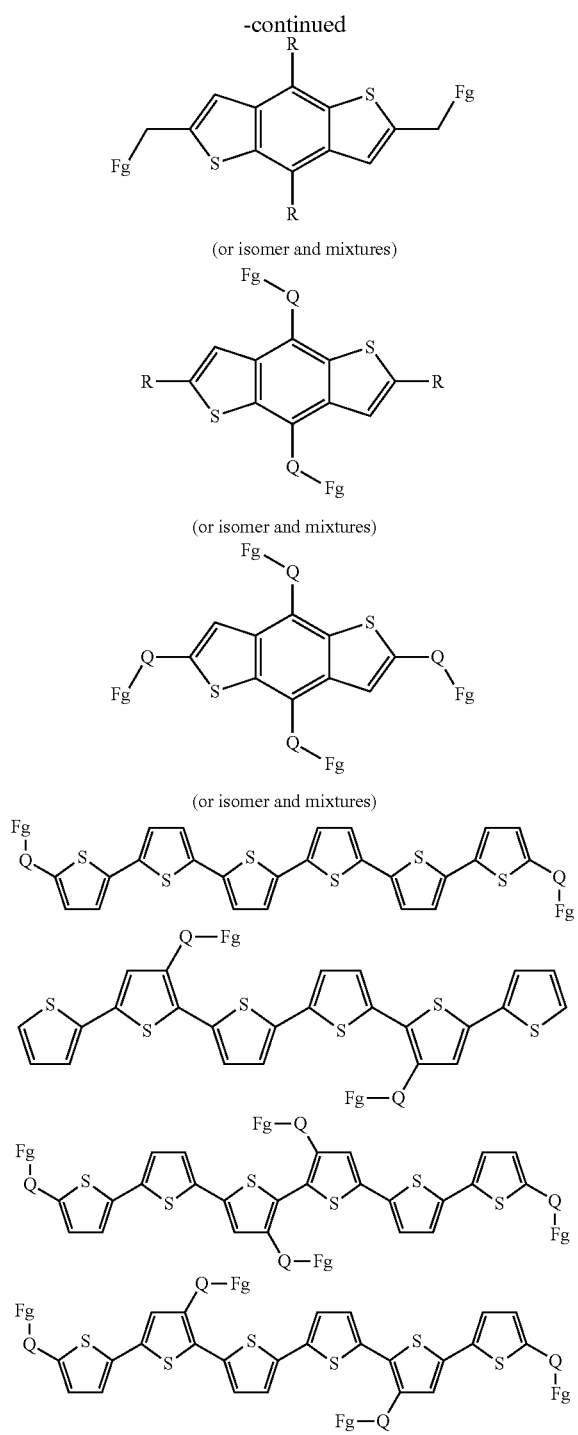

(or isomer and mixtures)

(or isomer and mixtures)

(or isomer and mixtures)

Examples of molecular building blocks comprising perylene bisimide core segments with inclined semiconductor properties may be derived from the chemical structure below:

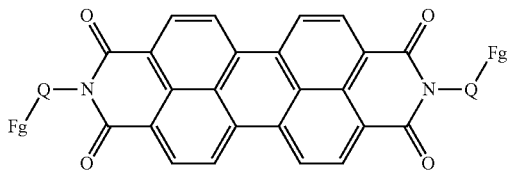

Molecular building blocks comprising tetrathiofulvalene core segments with inclined semiconductor properties may be derived from the list of chemical structures including, for example, those listed below:

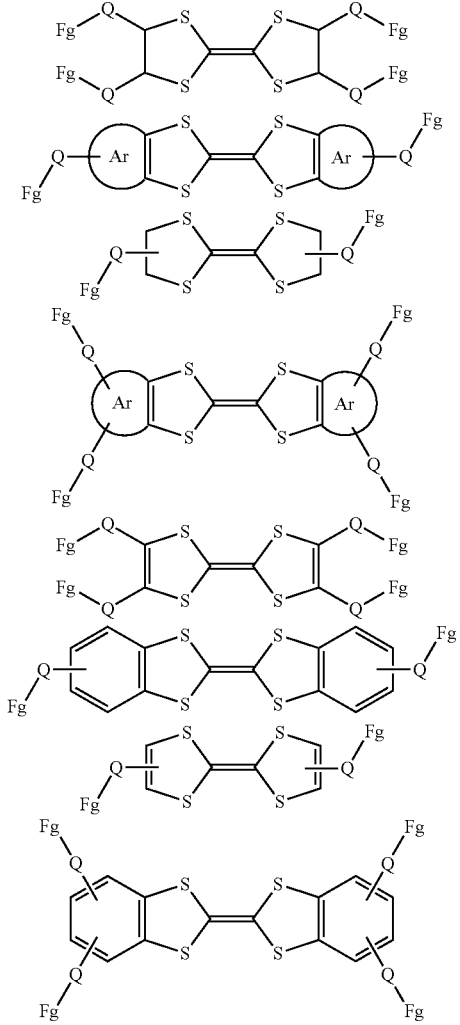

wherein Ar each independently represents an aryl group that optionally contains one or more substituents or a heterocyclic group that optionally contains one or more substituents.

Similarly, the electroactivity of SOFs prepared by these molecular building blocks will depend on the nature of the segments, nature of the linkers, and how the segments are orientated within the SOF. Linkers that favor preferred orientations of the segment moieties in the SOF are expected to lead to higher electroactivity.

Process for Preparing an Ordered Structured Organic Film

The process for making SOFs, such as high mobility SOFs, which may have periodic regions or portions, typically comprises a number of activities or steps (set forth below) that may be performed in any suitable sequence or where two or more activities are performed simultaneously or in close proximity in time:

A process for preparing a structured organic film comprising:
(a) preparing a liquid-containing reaction mixture comprising a plurality of molecular building blocks each, comprising a segment and a number of functional groups, and a pre-SOF;

(b) depositing the reaction mixture as a wet film;

(c) promoting a change of the wet film including the molecular building blocks to a dry film comprising the SOF comprising a plurality of the segments and a plurality of linkers arranged as a covalent organic framework, wherein at a macroscopic level the covalent organic framework is a film;

(d) optionally removing the SOF from the coating substrate to obtain a free-standing SOF;

(e) optionally processing the free-standing SOF into a roll;

(f) optionally cutting and seaming the SOF into a belt; a (g) optionally performing the above SOF formation process(es) upon an SOF (which was prepared by the above SOF formation process(es)) as a substrate for subsequent SOF formation process(es); and (h) optionally performing a computer simulation or materials modeling of a various SOF compositions to select specific molecular building blocks and reaction components.

The process for making capped regions of the SOFs and/or composite SOFs typically comprises a similar number of activities or steps (set forth above) that are used to make a non-capped SOF. The capping unit and/or secondary component may be added during either step a, b or c, depending the desired distribution of the capping unit in the resulting SOF. For example, if it is desired that the capping unit and/or secondary component distribution is substantially uniform over the resulting SOF, the capping unit may be added during step a. Alternatively, if, for example, a more heterogeneous distribution of the capping unit and/or secondary component is desired, adding the capping unit and/or secondary component (such as by spraying it on the film formed during step b or during the promotion step of step c) may occur during steps b and c.

The above activities or steps may be conducted at atmospheric, super atmospheric, or subatmospheric pressure. The term "atmospheric pressure" as used herein refers to a pressure of about 760 torr. The term "super atmospheric" refers to pressures greater than atmospheric pressure, but less than 20 atm. The term "subatmospheric pressure" refers to pressures less than atmospheric pressure. In an embodiment, the activities or steps may be conducted at or near atmospheric pressure. Generally, pressures of from about 0.1 atm to about 2 atm, such as from about 0.5 atm to about 1.5 atm, or 0.8 atm to about 1.2 atm may be conveniently employed.

Process Action A: Preparation of the Liquid-Containing Reaction Mixture

The reaction mixture comprises a plurality of molecular building blocks that are dissolved, suspended, or mixed in a liquid. The plurality of molecular building blocks may be of one type or two or more types. When one or more of the molecular building blocks is a liquid, the use of an additional liquid is optional. Catalysts may optionally be added to the reaction mixture to enable pre-SOF formation and/or modify the kinetics of SOF formation during Action C described above. The term "pre-SOF" may refer to, for example, at least two molecular building blocks that have reacted and have a molecular weight higher than the starting molecular building block and contain multiple functional groups capable of undergoing further reactions with functional groups of other building blocks or pre-SOFs to obtain a SOF, which may be a substantially defect-free or defect-free SOF, and/or the 'activation' of molecular building block functional groups that imparts enhanced or modified reactivity for the film forming process. Activation may include dissociation of a functional group moiety, pre-association with a catalyst, association with a solvent molecule, liquid, second solvent, second liquid, secondary component, or with any entity that modifies functional group reactivity. In embodiments, pre-SOF formation may include the reaction between molecular building blocks or the 'activation' of molecular building block functional groups, or a combination of the two. The formation of the "pre-SOF" may be achieved by in a number of ways, such as heating the reaction mixture, exposure of the reaction mixture to UV radiation, or any other means of partially reacting the molecular building blocks and/or activating functional groups in the reaction mixture prior to deposition of the wet layer on the substrate. Additives or secondary components may optionally be added to the reaction mixture to alter the physical properties of the resulting SOF.

The reaction mixture components (molecular building blocks, optionally a liquid, optionally catalysts, and optionally additives) are combined in a vessel. The order of addition of the reaction mixture components may vary; however, typically when a process for preparing a SOF includes a pre-SOF or formation of a pre-SOF, the catalyst, when present, may be added to the reaction mixture before depositing the reaction mixture as a wet film. In embodiments, the molecular building blocks may be reacted actinically, thermally, chemically or by any other means with or without the presence of a catalyst to obtain a pre-SOF. The pre-SOF and the molecular building blocks formed in the absence of catalyst may be may be heated in the liquid in the absence of the catalyst to aid the dissolution of the molecular building blocks and pre-SOFs. In embodiments, the pre-SOF and the molecular building blocks formed in the presence of catalyst may be may be heated at a temperature that does not cause significant further reaction of the molecular building blocks and/or the pre-SOFs to aid the dissolution of the molecular building blocks and pre-SOFs. The reaction mixture may also be mixed, stirred, milled, or the like, to ensure even distribution of the formulation components prior to depositing the reaction mixture as a wet film.

In embodiments, the reaction mixture may be heated prior to being deposited as a wet film. This may aid the dissolution of one or more of the molecular building blocks and/or increase the viscosity of the reaction mixture by the partial reaction of the reaction mixture prior to depositing the wet layer to form pre-SOFs. For example, the weight percent of molecular building blocks in the reaction mixture that are incorporated into pre-reacted molecular building blocks pre-SOFs may be less than 20%, such as about 15% to about 1%, or 10% to about 5%. In embodiments, the molecular weight of the 95% pre-SOF molecules is less than 5,000 daltons, such as 2,500 daltons, or 1,000 daltons. The preparation of pre-SOFs may be used to increase the loading of the molecular building blocks in the reaction mixture.

In the case of pre-SOF formation via functional group activation, the molar percentage of functional groups that are activated may be less than 50%, such as about 30% to about 10%, or about 10% to about 5%.

In embodiments, the two methods of pre-SOF formation (pre-SOF formation by the reaction between molecular building blocks or pre-SOF formation by the 'activation' of molecular building block functional groups) may occur in combination and the molecular building blocks incorporated into pre-SOF structures may contain activated functional groups. In embodiments, pre-SOF formation by the reaction between molecular building blocks and pre-SOF formation by the 'activation' of molecular building block functional groups may occur simultaneously.

In embodiments, the duration of pre-SOF formation lasts about 10 seconds to about 48 hours, such as about 30 seconds to about 12 hours, or about 1 minute to 6 hours.

In particular embodiments, the reaction mixture needs to have a viscosity that will support the deposited wet layer.

Reaction mixture viscosities range from about 10 to about 50,000 cps, such as from about 25 to about 25,000 cps or from about 50 to about 1000 cps.

The molecular building block and capping unit loading or "loading" in the reaction mixture is defined as the total weight of the molecular building blocks and optionally the capping units and catalysts divided by the total weight of the reaction mixture. Building block loadings may range from about 3 to 100%, such as from about 5 to about 50%, or from about 15 to about 40%. In the case where a liquid molecular building block is used as the only liquid component of the reaction mixture (i.e. no additional liquid is used), the building block loading would be about 100%. The capping unit loading may be chosen, so as to achieve the desired loading of the capping group. For example, depending on when the capping unit is to be added to the reaction mixture, capping unit loadings may range, by weight, from about 3 to 80%, such as from about 5 to about 50%, or from about 15 to about 40% by weight.

In embodiments, the theoretical upper limit for capping unit loading is the molar amount of capping units that reduces the number of available linking groups to 2 per molecular building block in the liquid SOF formulation. In such a loading, substantial SOF formation may be effectively inhibited by exhausting (by reaction with the respective capping group) the number of available linkable functional groups per molecular building block. For example, in such a situation (where the capping unit loading is in an amount sufficient to ensure that the molar excess of available linking groups is less than 2 per molecular building block in the liquid SOF formulation), oligomers, linear polymers, and molecular building blocks that are fully capped with capping units may predominately form instead of an SOF.

In embodiments, the pre-SOF may be made from building blocks with one or more of the added functionality selected from the group consisting of hydrophobic added functionality, superhydrophobic added functionality, hydrophilic added functionality, lipophobic added functionality, superlipophobic added functionality, lipophilic added functionality, photochromic added functionality, and electroactive added functionality. In embodiments, the inclined property of the molecular building blocks is the same as the added functionality of the pre-SOF. In embodiments, the added functionality of the SOF is not an inclined property of the molecular building blocks.

Liquids used in the reaction mixture may be pure liquids, such as solvents, and/or solvent mixtures. Liquids are used to dissolve or suspend the molecular building blocks and catalyst/modifiers in the reaction mixture. Liquid selection is generally based on balancing the solubility/dispersion of the molecular building blocks and a particular building block loading, the viscosity of the reaction mixture, and the boiling point of the liquid, which impacts the promotion of the wet layer to the dry SOF. Suitable liquids may have boiling points from about 30 to about 300° C., such as from about 65° C. to about 250° C., or from about 100° C. to about 180° C.

Liquids may include molecule classes such as alkanes (hexane, heptane, octane, nonane, decane, cyclohexane, cycloheptane, cyclooctane, decalin); mixed alkanes (hexanes, heptanes); branched alkanes (isooctane); aromatic compounds (toluene, o-, m-, p-xylene, mesitylene, nitrobenzene, benzonitrile, butylbenzene, aniline); ethers (benzyl ethyl ether, butyl ether, isoamyl ether, propyl ether); cyclic ethers (tetrahydrofuran, dioxane), esters (ethyl acetate, butyl acetate, butyl butyrate, ethoxyethyl acetate, ethyl propionate, phenyl acetate, methyl benzoate); ketones (acetone, methyl ethyl ketone, methyl isobutylketone, diethyl ketone, chloroacetone, 2-heptanone), cyclic ketones (cyclopentanone, cyclohexanone), amines (1°, 2°, or 3° amines such as butylamine, diisopropylamine, triethylamine, diisoproylethylamine; pyridine); amides (dimethylformamide, N-methylpyrrolidinone, N,N-dimethylformamide); alcohols (methanol, ethanol, n-, propanol, n-, i-, t-butanol, 1-methoxy-2-propanol, hexanol, cyclohexanol, 3-pentanol, benzyl alcohol); nitriles (acetonitrile, benzonitrile, butyronitrile), halogenated aromatics (chlorobenzene, dichlorobenzene, hexafluorobenzene), halogenated alkanes (dichloromethane, chloroform, dichloroethylene, tetrachloroethane); and water.

Mixed liquids comprising a first solvent, second solvent, third solvent, and so forth may also be used in the reaction mixture. Two or more liquids may be used to aid the dissolution/dispersion of the molecular building blocks; and/or increase the molecular building block loading; and/or allow a stable wet film to be deposited by aiding the wetting of the substrate and deposition instrument; and/or modulate the promotion of the wet layer to the dry SOF. In embodiments, the second solvent is a solvent whose boiling point or vapor-pressure curve or affinity for the molecular building blocks differs from that of the first solvent. In embodiments, a first solvent has a boiling point higher than that of the second solvent. In embodiments, the second solvent has a boiling point equal to or less than about 100° C., such as in the range of from about 30° C. to about 100° C., or in the range of from about 40° C. to about 90° C., or about 50° C. to about 80° C.

In embodiments, the first solvent, or higher boiling point solvent, has a boiling point equal to or greater than about 65° C., such as in the range of from about 80° C. to about 300° C., or in the range of from about 100° C. to about 250° C., or about 100° C. to about 180° C. The higher boiling point solvent may include, for example, the following (the value in parentheses is the boiling point of the compound): hydrocarbon solvents such as amylbenzene (202° C.), isopropylbenzene (152° C.), 1,2-diethylbenzene (183° C.), 1,3-diethylbenzene (181° C.), 1,4-diethylbenzene (184° C.), cyclohexylbenzene (239° C.), dipentene (177° C.), 2,6-dimethylnaphthalene (262° C.), p-cymene (177° C.), camphor oil (160-185° C.), solvent naphtha (110-200° C.), cis-decalin (196° C.), trans-decalin (187° C.), decane (174° C.), tetralin (207° C.), turpentine oil (153-175° C.), kerosene (200-245° C.), dodecane (216° C.), dodecylbenzene (branched), and so forth; ketone and aldehyde solvents such as acetophenone (201.7° C.), isophorone (215.3° C.), phorone (198-199° C.), methylcyclohexanone (169.0-170.5° C.), methyl n-heptyl ketone (195.3° C.), and so forth; ester solvents such as diethyl phthalate (296.1° C.), benzyl acetate (215.5° C.), γ-butyrolactone (204° C.), dibutyl oxalate (240° C.), 2-ethylhexyl acetate (198.6° C.), ethyl benzoate (213.2° C.), benzyl formate (203° C.), and so forth; diethyl sulfate (208° C.), sulfolane (285° C.), and halohydrocarbon solvents; etherified hydrocarbon solvents; alcohol solvents; ether/acetal solvents; polyhydric alcohol solvents; carboxylic anhydride solvents; phenolic solvents; water; and silicone solvents.

The ratio of the mixed liquids may be established by one skilled in the art. The ratio of liquids a binary mixed liquid may be from about 1:1 to about 99:1, such as from about 1:10 to about 10:1, or about 1:5 to about 5:1, by volume. When n liquids are used, with n ranging from about 3 to about 6, the amount of each liquid ranges from about 1% to about 95% such that the sum of each liquid contribution equals 100%.

In embodiments, the mixed liquid comprises at least a first and a second solvent with different boiling points. In further embodiments, the difference in boiling point between the first and the second solvent may be from about nil to about 150° C., such as from nil to about 50° C. For example, the boiling point of the first solvent may exceed the boiling point of the second solvent by about 1° C. to about 100° C., such as by about 5° C. to about 100° C., or by about 10° C. to about 50° C. The mixed liquid may comprise at least a first and a second solvent with different vapor pressures, such as combinations of high vapor pressure solvents and/or low vapor pressure solvents. The term "high vapor pressure solvent" refers to, for example, a solvent having a vapor pressure of at least about 1 kPa, such as about 2 kPa, or about 5 kPa. The term "low vapor pressure solvent" refers to, for example, a solvent having a vapor pressure of less than about 1 kPa, such as about 0.9 kPa, or about 0.5 kPa. In embodiments, the first solvent may be a low vapor pressure solvent such as, for example, terpineol, diethylene glycol, ethylene glycol, hexylene glycol, N-methyl-2-pyrrolidone, and tri(ethylene glycol)dimethyl ether. A high vapor pressure solvent allows rapid removal of the solvent by drying and/or evaporation at temperatures below the boiling point. High vapor pressure solvents may include, for example, acetone, tetrahydrofuran, toluene, xylene, ethanol, methanol, 2-butanone and water.

In embodiments where mixed liquids comprising a first solvent, second solvent, third solvent, and so forth are used in the reaction mixture, promoting the change of the wet film and forming the dry SOF may comprise, for example, heating the wet film to a temperature above the boiling point of the reaction mixture to form the dry SOF film; or heating the wet film to a temperature above the boiling point of the second solvent (below the temperature of the boiling point of the first solvent) in order to remove the second solvent while substantially leaving the first solvent and then after substantially removing the second solvent, removing the first solvent by heating the resulting composition at a temperature either above or below the boiling point of the first solvent to form the dry SOF film; or heating the wet film below the boiling point of the second solvent in order to remove the second solvent (which is a high vapor pressure solvent) while substantially leaving the first solvent and, after removing the second solvent, removing the first solvent by heating the resulting composition at a temperature either above or below the boiling point of the first solvent to form the dry SOF film.

The term "substantially removing" refers to, for example, the removal of at least 90% of the respective solvent, such as about 95% of the respective solvent. The term "substantially leaving" refers to, for example, the removal of no more than 2% of the respective solvent, such as removal of no more than 1% of the respective solvent.

These mixed liquids may be used to slow or speed up the rate of conversion of the wet layer to the SOF in order to manipulate the characteristics of the SOFs. For example, in condensation and addition/elimination linking chemistries, liquids such as water, 1°, 2°, or 3° alcohols (such as methanol, ethanol, propanol, isopropanol, butanol, 1-methoxy-2-propanol, tert-butanol) may be used.

Optionally a catalyst may be present in the reaction mixture to assist the promotion of the wet layer to the dry SOF. Selection and use of the optional catalyst depends on the functional groups on the molecular building blocks. Catalysts may be homogeneous (dissolved) or heterogeneous (undissolved or partially dissolved) and include Brönsted acids (HCl (aq), acetic acid, p-toluenesulfonic acid, amine-protected p-toluenesulfonic acid such as pyrridium p-toluenesulfonate, trifluoroacetic acid); Lewis acids (boron trifluoroetherate, aluminum trichloride); Brönsted bases (metal hydroxides such as sodium hydroxide, lithium hydroxide, potassium hydroxide; 1°, 2°, or 3° amines such as butylamine, diisopropylamine, triethylamine, diisoproylethylamine); Lewis bases (N,N-dimethyl-4-aminopyridine); metals (Cu bronze); metal salts ($FeCl_3$, $AuCl_3$); and metal complexes (ligated palladium complexes, ligated ruthenium catalysts). Typical catalyst loading ranges from about 0.01% to about 25%, such as from about 0.1% to about 5% of the molecular building block loading in the reaction mixture. The catalyst may or may not be present in the final SOF composition.

Optionally additives or secondary components, such as dopants, may be present in the reaction mixture and wet layer. Such additives or secondary components may also be integrated into a dry SOF. Additives or secondary components can be homogeneous or heterogeneous in the reaction mixture and wet layer or in a dry SOF. The terms "additive" or "secondary component," refer, for example, to atoms or molecules that are not covalently bound in the SOF, but are randomly distributed in the composition. In embodiments, secondary components such as conventional additives may be used to take advantage of the known properties associated with such conventional additives. Such additives may be used to alter the physical properties of the SOF such as electrical properties (conductivity, semiconductivity, electron transport, hole transport), surface energy (hydrophobicity, hydrophilicity), tensile strength, and thermal conductivity; such additives may include impact modifiers, reinforcing fibers, lubricants, antistatic agents, coupling agents, wetting agents, antifogging agents, flame retardants, ultraviolet stabilizers, antioxidants, biocides, dyes, pigments, odorants, deodorants, nucleating agents and the like.

In embodiments, the SOF may contain antioxidants as a secondary component to protect the SOF from oxidation. Examples of suitable antioxidants include (1) N,N'-hexamethylene bis(3,5-di-tert-butyl-4-hydroxy hydrocinnamamide) (IRGANOX 1098, available from Ciba-Geigy Corporation), (2) 2,2-bis(4-(2-(3,5-di-tert-butyl-4-hydroxyhydrocinnamoyloxy))ethoxyphenyl) propane (TOPANOL-205, available from ICI America Corporation), (3) tris(4-tert-butyl-3-hydroxy-2,6-dimethyl benzyl) isocyanurate (CYANOX 1790, 41,322-4, LTDP, Aldrich D12, 840-6), (4) 2,2'-ethylidene bis(4,6-di-tert-butylphenyl) fluoro phosphonite (ETHANOX-398, available from Ethyl Corporation), (5) tetrakis(2,4-di-tert-butylphenyl)-4,4'-biphenyl diphosphonite (ALDRICH 46, 852-5; hardness value 90), (6) pentaerythritol tetrastearate (TCI America #PO739), (7) tributylammonium hypophosphite (Aldrich 42,009-3), (8) 2,6-di-tert-butyl-4-methoxyphenol (Aldrich 25, 106-2), (9) 2,4-di-tert-butyl-6-(4-methoxybenzyl) phenol (Aldrich 23,008-1), (10) 4-bromo-2,6-dimethylphenol (Aldrich 34, 951-8), (11) 4-bromo-3,5-didimethylphenol (Aldrich B6, 420-2), (12) 4-bromo-2-nitrophenol (Aldrich 30, 987-7), (13) 4-(diethyl aminomethyl)-2,5-dimethylphenol (Aldrich 14, 668-4), (14) 3-dimethylaminophenol (Aldrich D14, 400-2), (15) 2-amino-4-tert-amylphenol (Aldrich 41, 258-9), (16) 2,6-bis(hydroxymethyl)-p-cresol (Aldrich 22, 752-8), (17) 2,2'-methylenediphenol (Aldrich B4, 680-8), (18) 5-(diethylamino)-2-nitrosophenol (Aldrich 26, 951-4), (19) 2,6-dichloro-4-fluorophenol (Aldrich 28, 435-1), (20) 2,6-dibromo fluoro phenol (Aldrich 26,003-7), (21) a trifluoro-o-cresol (Aldrich 21, 979-7), (22) 2-bromo-4-fluorophenol (Aldrich 30, 246-5), (23) 4-fluorophenol (Aldrich F1, 320-7), (24) 4-chlorophenyl-2-chloro-1,1,2-tri-fluoroethyl sulfone (Aldrich 13, 823-1), (25) 3,4-difluoro phenylacetic acid (Aldrich 29,043-2), (26) 3-fluorophenylacetic acid (Aldrich 24, 804-5), (27) 3,5-difluoro phenylacetic acid (Aldrich 29,044-0), (28) 2-fluorophenylacetic acid (Aldrich 20, 894-9), (29) 2,5-bis(trifluoromethyl) benzoic acid (Aldrich 32, 527-9), (30) ethyl-2-(4-(4-(trifluoromethyl)phenoxy)phenoxy) propionate (Aldrich 25,074-0), (31) tetrakis(2,4-di-tert-butyl phenyl)-4,4'-biphenyl diphosphonite (Aldrich 46, 852-5), (32) 4-tert-amyl phenol (Aldrich 15, 384-2), (33) 3-(2H-benzotriazol-2-yl)-4-hydroxy phenethylalcohol (Aldrich 43,071-4), NAUGARD 76, NAUGARD 445, NAUGARD 512, and NAUGARD 524 (manufactured by Uniroyal Chemical Company), and the like, as well as mixtures thereof. The antioxidant, when present, may be present in the SOF composite in any desired or effective amount, such as from about 0.25 percent to about 10 percent by weight of the SOF or from about 1 percent to about 5 percent by weight of the SOF.

In embodiments, the SOF may further comprise any suitable polymeric material known in the art as a secondary component, such as polycarbonates, acrylate polymers, vinyl polymers, cellulose polymers, polyesters, polysiloxanes, polyamides, polyurethanes, polystyrenes, polystyrene, polyolefins, fluorinated hydrocarbons (fluorocarbons), and engineered resins as well as block, random or alternating copolymers thereof. The SOF composite may comprise homopolymers, higher order polymers, or mixtures thereof, and may comprise one species of polymeric material or mixtures of multiple species of polymeric material, such as mixtures of two, three, four, five or more multiple species of polymeric material. In embodiments, suitable examples of the about polymers include, for example, crystalline and amorphous polymers, or a mixtures thereof. In embodiments, the polymer is a fluoroelastomer.

Suitable fluoroelastomers are those described in detail in U.S. Pat. Nos. 5,166,031, 5,281,506, 5,366,772, 5,370,931, 4,257,699, 5,017,432 and 5,061,965, the disclosures each of which are incorporated by reference herein in their entirety. The amount of fluoroelastomer compound present in the SOF, in weight percent total solids, is from about 1 to about 50 percent, or from about 2 to about 10 percent by weight of the SOF. Total solids, as used herein, includes the amount of secondary components and SOF.

In embodiments, examples of styrene-based monomer and acrylate-based monomers include, for example, poly(styrene-alkyl acrylate), poly(styrene-1,3-diene), poly(styrene-alkyl methacrylate), poly(styrene-alkyl acrylate-acrylic acid), poly(styrene-1,3-diene-acrylic acid), poly(styrene-alkyl methacrylate-acrylic acid), poly(alkyl methacrylate-alkyl acrylate), poly(alkyl methacrylate-aryl acrylate), poly(aryl methacrylate-alkyl acrylate), poly(alkyl methacrylate-acrylic acid), poly(styrene-alkyl acrylate-acrylonitrile-acrylic acid), poly(styrene-1,3-diene-acrylonitrile-acrylic acid), poly(alkyl acrylate-acrylonitrile-acrylic acid), poly(styrene-butadiene), poly(methylstyrene-butadiene), poly(methyl methacrylate-butadiene), poly(ethyl methacrylate-butadiene), poly(propyl methacrylate-butadiene), poly(butyl methacrylate-butadiene), poly(methyl acrylate-butadiene), poly(ethyl acrylate-butadiene), poly(propyl acrylate-butadiene), poly(butyl acrylate-butadiene), poly(styrene-isoprene), poly(methylstyrene-isoprene), poly(methyl methacrylate-isoprene), poly(ethyl methacrylate-isoprene), poly(propyl methacrylate-isoprene), poly(butyl methacrylate-isoprene), poly(methyl acrylate-isoprene), poly(ethyl acrylate-isoprene), poly(propyl acrylate-isoprene), and poly(butyl acrylate-isoprene); poly(styrene-propyl acrylate), poly(styrene-butyl acrylate), poly(styrene-butadiene-acrylic acid), poly(styrene-butadiene-methacrylic acid), poly(styrene-butadiene-acrylonitrile-acrylic acid), poly(styrene-butyl acrylate-acrylic acid), poly(styrene-butyl acrylate-methacrylic acid), poly(styrene-butyl acrylate-acrylonitrile), poly(styrene-butyl acrylate-acrylonitrile-acrylic acid), and other similar polymers.

Further examples of the various polymers that are suitable for use as a secondary component in SOFs include polyethylene terephthalate, polybutadienes, polysulfones, polyarylethers, polyarylsulfones, polyethersulfones, polycarbonates, polyethylenes, polypropylenes, polydecene, polydodecene, polytetradecene, polyhexadecene, polyoctadene, and polycyclodecene, polyolefin copolymers, mixtures of polyolefins, functional polyolefins, acidic polyolefins, branched polyolefins, polymethylpentenes, polyphenylene sulfides, polyvinyl acetates, polyvinylbutyrals, polysiloxanes, polyacrylates, polyvinyl acetals, polyamides, polyimides, polystyrene and acrylonitrile copolymers, polyvinylchlorides, polyvinyl alcohols, poly-N-vinylpyrrolidinone)s, vinylchloride and vinyl acetate copolymers, acrylate copolymers, poly(amideimide), styrene-butadiene copolymers, vinylidenechloride-vinylchloride copolymers, vinylacetate-vinylidenechloride copolymers, polyvinylcarbazoles, polyethylene-terephthalate, polypropylene-terephthalate, polybutylene-terephthalate, polypentylene-terephthalate, polyhexylene-terephthalate, polyheptadene-terephthalate, polyoctalene-terephthalate, polyethylene-sebacate, polypropylene sebacate, polybutylene-sebacate, polyethylene-adipate, polypropylene-adipate, polybutylene-adipate, polypentylene-adipate, polyhexylene-adipate, polyheptadene-adipate, polyoctalene-adipate, polyethylene-glutarate, polypropylene-glutarate, polybutylene-glutarate, polypentylene-glutarate, polyhexylene-glutarate, polyheptadene-glutarate, polyoctalene-glutarate polyethylene-pimelate, polypropylene-pimelate, polybutylene-pimelate, polypentylene-pimelate, polyhexylene-pimelate, polyheptadene-pimelate, poly(propoxylated bisphenol-fumarate), poly(propoxylated bisphenol-succinate), poly(propoxylated bisphenol-adipate), poly(propoxylated bisphenol-glutarate), SPAR™ (Dixie Chemicals), BECKOSOL™ (Reichhold Chemical Inc), ARAKOTE™ (Ciba-Geigy Corporation), HETRON™ (Ashland Chemical), PARAPLEX™ (Rohm & Hass), POLYLITE™ (Reichhold Chemical Inc), PLASTHALL™ (Rohm & Hass), CYGAL™ (American Cyanamide), ARMCO™ (Armco Composites), ARPOL™ (Ashland Chemical), CELANEX™ (Celanese Eng), RYNITE™ (DuPont), STYPOL™ (Freeman Chemical Corporation) mixtures thereof and the like.

In embodiments, the secondary components, including polymers may be distributed homogeneously, or heterogeneously, such as in a linear or nonlinear gradient in the SOF. In embodiments, the polymers may be incorporated into the SOF in the form of a fiber, or a particle whose size may range from about 50 nm to about 2 mm. The polymers, when present, may be present in the SOF composite in any desired or effective amount, such as from about 1 percent to about 50 percent by weight of the SOF or from about 1 percent to about 15 percent by weight of the SOF.

In embodiments, the SOF may further comprise carbon nanotubes or nanofiber aggregates, which are microscopic particulate structures of nanotubes, as described in U.S. Pat. Nos. 5,165,909; 5,456,897; 5,707,916; 5,877,110; 5,110,693; 5,500,200 and 5,569,635, all of which are hereby entirely incorporated by reference.

In embodiments, the SOF may further comprise metal particles as a secondary component; such metal particles include noble and non-noble metals and their alloys. Examples of suitable noble metals include, aluminum, titanium, gold, silver, platinum, palladium and their alloys. Examples of suitable non-noble metals include, copper, nickel, cobalt, lead, iron, bismuth, zinc, ruthenium, rhodium, rubidium, indium, and their alloys. The size of the metal particles may range from about 1 nm to 1 mm and their surfaces may be modified by stabilizing molecules or dispersant molecules or the like. The metal particles, when present, may be present in the SOF composite in any desired or effective amount, such as from about 0.25 percent to about 70 percent by weight of the SOF or from about 1 percent to about 15 percent by weight of the SOF.

In embodiments, the SOF may further comprise oxides and sulfides as secondary components. Examples of suitable metal oxides include, titanium dioxide (titania, rutile and related polymorphs), aluminum oxide including alumina, hydradated alumina, and the like, silicon oxide including silica, quartz, cristobalite, and the like, aluminosilicates including zeolites, talcs, and clays, nickel oxide, iron oxide, cobalt oxide. Other examples of oxides include glasses, such as silica glass, borosilicate glass, aluminosilicate glass and the like. Examples of suitable sulfides include nickel sulfide, lead sulfide, cadmium sulfide, tin sulfide, and cobalt sulfide. The diameter of the oxide and sulfide materials may range from about 50 nm to 1 mm and their surfaces may be modified by stabilizing molecules or dispersant molecules or the like. The oxides, when present, may be present in the SOF composite in any desired or effective amount, such as from about 0.25 percent to about 20 percent by weight of the SOF or from about 1 percent to about 15 percent by weight of the SOF.

In embodiments, the SOF may further comprise metalloid or metal-like elements from the periodic table. Examples of suitable metalloid elements include, silicon, selenium, tellurium, tin, lead, germanium, gallium, arsenic, antimony and their alloys or intermetallics. The size of the metal particles may range from about 10 nm to 1 mm and their surfaces may be modified by stabilizing molecules or dispersant molecules or the like. The metalloid particles, when present, may be present in the SOF composite in any desired or effective amount, such as from about 0.25 percent to about 10 percent by weight of the SOF or from about 1 percent to about 5 percent by weight of the SOF.

In embodiments, the SOF may further comprise hole transport molecules or electron acceptors as a secondary component, such charge transport molecules include for example a positive hole transporting material selected from compounds having in the main chain or the side chain a polycyclic aromatic ring such, as anthracene, pyrene, phenanthrene, coronene, and the like, or a nitrogen-containing hetero ring such as indole, carbazole, oxazole, isoxazole, thiazole, imidazole, pyrazole, oxadiazole, pyrazoline, thiadiazole, triazole, and hydrazone compounds. Typical hole transport materials include electron donor materials, such as carbazole; N-ethyl carbazole; N-isopropyl carbazole; N-phenyl carbazole; tetraphenylpyrene; 1-methylpyrene; perylene; chrysene; anthracene; tetraphene; 2-phenyl naphthalene; azopyrene; 1-ethyl pyrene; acetyl pyrene; 2,3-benzochrysene; 2,4-benzopyrene; 1,4-bromopyrene; poly (N-vinylcarbazole); poly (vinylpyrene); poly(vinyltetraphene); poly(vinyltetracene) and poly(vinylperylene). Suitable electron transport materials include electron acceptors such as 2,4,7-trinitro-9-fluorenone; 2,4,5,7-tetranitro-fluorenone; dinitroanthracene; dinitroacridene; tetracyanopyrene; dinitroanthraquinone; and butylcarbonylfluorenemalononitrile, see U.S. Pat. No. 4,921,769 the disclosure of which is incorporated herein by reference in its entirety. Other hole transporting materials include arylamines described in U.S. Pat. No. 4,265,990 the disclosure of which is incorporated herein by reference in its entirety, such as N,N'-diphenyl-N,N'-bis(alkylphenyl)-(1,1'-biphenyl)-4,4'-diamine wherein alkyl is selected from the group consisting of methyl, ethyl, propyl, butyl, hexyl, and the like. Hole transport molecules of the type described in, for example, U.S. Pat. Nos. 4,306,008; 4,304,829; 4,233,384; 4,115,116; 4,299,897; 4,081,274, and 5,139,910, the entire disclosures of each are incorporated herein by reference. Other known charge transport layer molecules may be selected, reference for example U.S. Pat. Nos. 4,921,773 and 4,464,450 the disclosures of which are incorporated herein by reference in their entireties. The hole transport molecules or electron acceptors, when present, may be present in the SOF composite in any desired or effective amount, such as from about 0.25 percent to about 50 percent by weight of the SOF or from about 1 percent to about 20 percent by weight of the SOF.

In embodiments, the SOF may further comprise biocides as a secondary component. Biocides may be present in amounts of from about 0.1 to about 1.0 percent by weight of the SOF. Suitable biocides include, for example, sorbic acid, 1-(3-chloroallyl)-3,5,7-triaza-1-azoniaadamantane chloride, commercially available as DOWICIL 200 (Dow Chemical Company), vinylene-bis thiocyanate, commercially available as CYTOX 3711 (American Cyanamid Company), disodium ethylenebis-dithiocarbamate, commercially available as DITHONE D14 (Rohm & Haas Company), bis(trichloromethyl)sulfone, commercially available as BIOCIDE N-1386 (Stauffer Chemical Company), zinc pyridinethione, commercially available as zinc omadine (Olin Corporation), 2-bromo-t-nitropropane-1,3-diol, commercially available as ONYXIDE 500 (Onyx Chemical Company), BOSQUAT MB50 (Louza, Inc.), and the like.

In embodiments, the SOF may further comprise small organic molecules as a secondary component; such small organic molecules include those discussed above with respect to the first and second solvents. The small organic molecules, when present, may be present in the SOF in any desired or effective amount, such as from about 0.25 percent to about 50 percent by weight of the SOF or from about 1 percent to about 10 percent by weight of the SOF.

When present, the secondary components or additives may each, or in combination, be present in the composition in any desired or effective amount, such as from about 1 percent to about 50 percent by weight of the composition or from about 1 percent to about 20 percent by weight of the composition.

SOFs may be modified with secondary components (dopants and additives, such as, hole transport molecules (mTBD), polymers (polystyrene), nanoparticles (C60 Buckminster fullerene), small organic molecules (biphenyl), metal particles (copper micropowder), and electron acceptors (quinone)) to give composite structured organic films. Secondary components may be introduced to the liquid formulation that is used to generate a wet film in which a change is promoted to form the SOF. Secondary components (dopants, additives, etc.) may either be dissolved or undissolved (suspended) in the reaction mixture. Secondary components are not bonded into the network of the film. For example, a secondary component may be added to a reaction mixture that contains a plurality of building blocks having four methoxy groups (—OMe) on a segment, such as N4,N4,N4',N4'-tetra-p-tolylbiphenyl-4,4'-diamine, which upon promotion of a change in the wet film, exclusively react with the two alcohol (—OH) groups on a building block, such as 1,4-benzenedimethanol, which contains a p-xylyl segment. The chemistry that is occurring to link building blocks is an acid catalyzed transetherfication reaction. Because —OH groups will only react with —OMe groups (and vice versa) and not with the secondary component, these molecular building blocks can only follow one pathway. Therefore, the SOF is programmed to order molecules in a way that leaves the secondary component incorporated within and/or around the SOF structure. This ability to pattern molecules and incorporate secondary components affords superior performance and unprecedented control over properties compared to conventional polymers and available alternatives.

Optionally additives or secondary components, such as dopants, may be present in the reaction mixture and wet layer. Such additives or secondary components may also be integrated into a dry SOF. Additives or secondary components can be homogeneous or heterogeneous in the reaction mixture and wet layer or in a dry SOF. In contrast to capping units, the terms "additive" or "secondary component," refer, for example, to atoms or molecules that are not covalently bound in the SOF, but are randomly distributed in the composition. Suitable secondary components and additives are described in U.S. patent application Ser. No. 12/716,324, entitled "Composite Structured Organic Films," the disclosure of which is totally incorporated herein by reference in its entirety.

In embodiments, the secondary components may have similar or disparate properties to accentuate or hybridize (synergistic effects or ameliorative effects as well as the ability to attenuate inherent or inclined properties of the capped SOF) the intended property of the capped SOF to enable it to meet performance targets. For example, doping the capped SOFs with antioxidant compounds will extend the life of the capped SOF by preventing chemical degradation pathways. Additionally, additives maybe added to improve the morphological properties of the capped SOF by tuning the reaction occurring during the promotion of the change of the reaction mixture to form the capped. SOF.

Process Action B: Depositing the Reaction Mixture as a Wet Film

The reaction mixture may be applied as a wet film to a variety of substrates using a number of liquid deposition techniques. The thickness of the SOF is dependant on the thickness of the wet film and the molecular building block loading in the reaction mixture. The thickness of the wet film is dependent on the viscosity of the reaction mixture and the method used to deposit the reaction mixture as a wet film.

Substrates include, for example, polymers, papers, metals and metal alloys, doped and undoped forms of elements from Groups III-VI of the periodic table, metal oxides, metal chalcogenides, and previously prepared SOFs or capped SOFs. Examples of polymer film substrates include polyesters, polyolefins, polycarbonates, polystyrenes, polyvinylchloride, block and random copolymers thereof, and the like. Examples of metallic surfaces include metallized polymers, metal foils, metal plates; mixed material substrates such as metals patterned or deposited on polymer, semiconductor, metal oxide, or glass substrates. Examples of substrates comprised of doped and undoped elements from Groups III-VI of the periodic table include, aluminum, silicon, silicon n-doped with phosphorous, silicon p-doped with boron, tin, gallium arsenide, lead, gallium indium phosphide, and indium. Examples of metal oxides include silicon dioxide, titanium dioxide, indium tin oxide, tin dioxide, selenium dioxide, and alumina. Examples of metal chalcogenides include cadmium sulfide, cadmium telluride, and zinc selenide. Additionally, it is appreciated that chemically treated or mechanically modified forms of the above substrates remain within the scope of surfaces which may be coated with the reaction mixture.

In embodiments, the substrate may be composed of, for example, silicon, glass plate, plastic film or sheet. For structurally flexible devices, a plastic substrate such as polyester, polycarbonate, polyimide sheets and the like may be used. The thickness of the substrate may be from around 10 micrometers to over 10 millimeters with an exemplary thickness being from about 50 to about 100 micrometers, especially for a flexible plastic substrate, and from about 1 to about 10 millimeters for a rigid substrate such as glass or silicon.

The reaction mixture may be applied to the substrate using a number of liquid deposition techniques including, for example, spin coating, blade coating, web coating, dip coating, cup coating, rod coating, screen printing, ink jet printing, spray coating, stamping and the like. The method used to deposit the wet layer depends on the nature, size, and shape of the substrate and the desired wet layer thickness. The thickness of the wet layer can range from about 10 nm to about 5 mm, such as from about 100 nm to about 1 mm, or from about 1 μm to about 500 μm.

In embodiments, the capping unit and/or secondary component may be introduced following completion of the above described process action B. The incorporation of the capping unit and/or secondary component in this way may be accomplished by any means that serves to distribute the capping unit and/or secondary component homogeneously, heterogeneously, or as a specific pattern over the wet film. Following introduction of the capping unit and/or secondary component subsequent process actions may be carried out resuming with process action C.

For example, following completion of process action B (i.e., after the reaction mixture may be applied to the substrate), capping unit(s) and/or secondary components (dopants, additives, etc.) may be added to the wet layer by any suitable method, such as by distributing (e.g., dusting, spraying, pouring, sprinkling, etc, depending on whether the capping unit and/or secondary component is a particle, powder or liquid) the capping unit(s) and/or secondary component on the top the wet layer. The capping units and/or secondary components may be applied to the formed wet layer in a homogeneous or heterogeneous manner, including various patterns, wherein the concentration or density of the capping unit(s) and/or secondary component is reduced in specific areas, such as to form a pattern of alternating bands of high and low concentrations of the capping unit(s) and/or secondary component of a given width on the wet layer. In embodiments, the application of the capping unit(s) and/or secondary component to the top of the wet layer may result in a portion of the capping unit(s) and/or secondary component diffusing or sinking into the wet layer and thereby forming a heterogeneous distribution of capping unit(s) and/or secondary component within the thickness of the SOF, such that a linear or nonlinear concentration gradient may be obtained in the resulting SOF obtained after promotion of the change of the wet layer to a dry SOF. In embodiments, a capping unit(s) and/or secondary component may be added to the top surface of a deposited wet layer, which upon promotion of a change in the wet film, results in an SOF having an heterogeneous distribution of the capping unit(s) and/or secondary component in the dry SOF. Depending on the density of the wet film and the density of the capping unit(s) and/or secondary component, a majority of the capping unit(s) and/or secondary component may end up in the upper half (which is opposite the substrate) of the dry SOF or a majority of the capping unit(s) and/or secondary component may end up in the lower half (which is adjacent to the substrate) of the dry SOF.

Process Action C: Promoting the Change of Wet Film to the Dry SOF

The term "promoting" refers, for example, to any suitable technique to facilitate a reaction of the molecular building blocks and/or pre-SOFs, such as a chemical reaction of the functional groups of the building blocks and/or pre-SOFs. In the case where a liquid needs to be removed to form the dry film, "promoting" also refers to removal of the liquid. Reaction of the molecular building blocks and/or pre-SOFs and removal of the liquid can occur sequentially or concurrently. In certain embodiments, the liquid is also one of the molecular building blocks and is incorporated into the SOF. The term "dry SOF" refers, for example, to substantially dry SOFs, for example, to a liquid content less than about 5% by weight of the SOF, or to a liquid content less than 2% by weight of the SOF.

In embodiments, the dry SOF or a given region of the dry SOF (such as the surface to a depth equal to of about 10% of the thickness of the SOF or a depth equal to of about 5% of the thickness of the SOF, the upper quarter of the SOF, or the regions discussed above) has a molar ratio of capping units to segments of from about 1:100 to about 1:1, such as from about 1:50 to about 1:2, or from about 1:20 to 1:4.

Promoting the wet layer to form a dry SOF may be accomplished by any suitable technique. Promoting the wet layer to form a dry SOF typically involves thermal treatment including, for example, oven drying, infrared radiation (IR), and the like with temperatures ranging from 40 to 350° C. and from 60 to 200° C. and from 85 to 160° C. The total heating time can range from about four seconds to about 24 hours, such as from one minute to 120 minutes, or from three minutes to 60 minutes.

In embodiments where a secondary component is present, the molecular size of the secondary component may be selected such that during the promotion of the wet layer to form a dry SOF the secondary component is trapped within the framework of the SOF such that the trapped secondary component will not leach from the SOF during exposure to a liquid toner or solvent.

IR promotion of the wet layer to the COF film may be achieved using an IR heater module mounted over a belt transport system. Various types of IR emitters may be used, such as carbon IR emitters or short wave IR emitters (available from Heraeus). Additional exemplary information regarding carbon ER emitters or short wave IR emitters is summarized in the following Table (Table 1).

TABLE 1

| Information regarding carbon IR emitters or short wave IR emitters | | | |
|---|---|---|---|
| IR lamp | Peak Wavelength | Number of lamps | Module Power (kW) |
| Carbon | 2.0 micron | 2 - twin tube | 4.6 |
| Short wave | 1.2-1.4 micron | 3 - twin tube | 4.5 |

Process Action D: Optionally Removing the SOF from the Coating Substrate to Obtain a Free-Standing SOF In embodiments, a free-standing SOF is desired. Free-standing SOFs may be obtained when an appropriate low adhesion substrate is used to support the deposition of the wet layer. Appropriate substrates that have low adhesion to the SOF may include, for example, metal foils, metalized polymer substrates, release papers and SOFs, such as SOFs prepared with a surface that has been altered to have a low adhesion or a decreased propensity for adhesion or attachment. Removal of the SOF from the supporting substrate may be achieved in a number of ways by someone skilled in the art. For example, removal of the SOF from the substrate may occur by starting from a corner or edge of the film and optionally assisted by passing the substrate and SOF over a curved surface.

Process Action E: Optionally Processing the Free-Standing SOF into a Roll

Optionally, a free-standing SOF or a SOF supported by a flexible substrate may be processed into a roll. The SOF may be processed into a roll for storage, handling, and a variety of other purposes. The starting curvature of the roll is selected such that the SOF is not distorted or cracked during the rolling process.

Process Action F: Optionally Cutting and Seaming the SOF into a Shape, Such as a Belt The method for cutting and seaming the SOF is similar to that described in U.S. Pat. No. 5,455,136 issued on Oct. 3, 1995 (for polymer films), the disclosure of which is herein totally incorporated by reference. An SOF belt may be fabricated from a single SOF, a multi layer SOF or an SOF sheet cut from a web. Such sheets may be rectangular in shape or any particular shape as desired. All sides of the SOF(s) may be of the same length, or one pair of parallel sides may be longer than the other pair of parallel sides. The SOF(s) may be fabricated into shapes, such as a belt by overlap joining the opposite marginal end regions of the SOF sheet. A seam is typically produced in the overlapping marginal end regions at the point of joining. Joining may be affected by any suitable means. Typical joining techniques include, for example, welding (including ultrasonic), gluing, taping, pressure heat fusing and the like. Methods, such as ultrasonic welding, are desirable general methods of joining flexible sheets because of their speed, cleanliness (no solvents) and production of a thin and narrow seam.

Process Action G: Optionally Using a SOF as a Substrate for Subsequent SOF Formation Processes A SOF may be used as a substrate in the SOF forming process to afford a multi-layered structured organic film. The layers of a multi-layered SOF may be chemically bound in or in physical contact. Chemically bound, multi-layered SOFs are formed when functional groups present on the substrate SOF surface can react with the molecular building blocks present in the deposited wet layer used to form the second structured organic film layer. Multi-layered SOFs in physical contact may not chemically bound to one another.

A SOF substrate may optionally be chemically treated prior to the deposition of the wet layer to enable or promote chemical attachment of a second SOF layer to form a multi-layered structured organic film.

Alternatively, a SOF substrate may optionally be chemically treated prior to the deposition of the wet layer to disable chemical attachment of a second SOF layer (surface pacification) to form a physical contact multi-layered SOF.

Other methods, such as lamination of two or more SOFs, may also be used to prepare physically contacted multi-layered SOFs.

EXAMPLES

Figure 2:
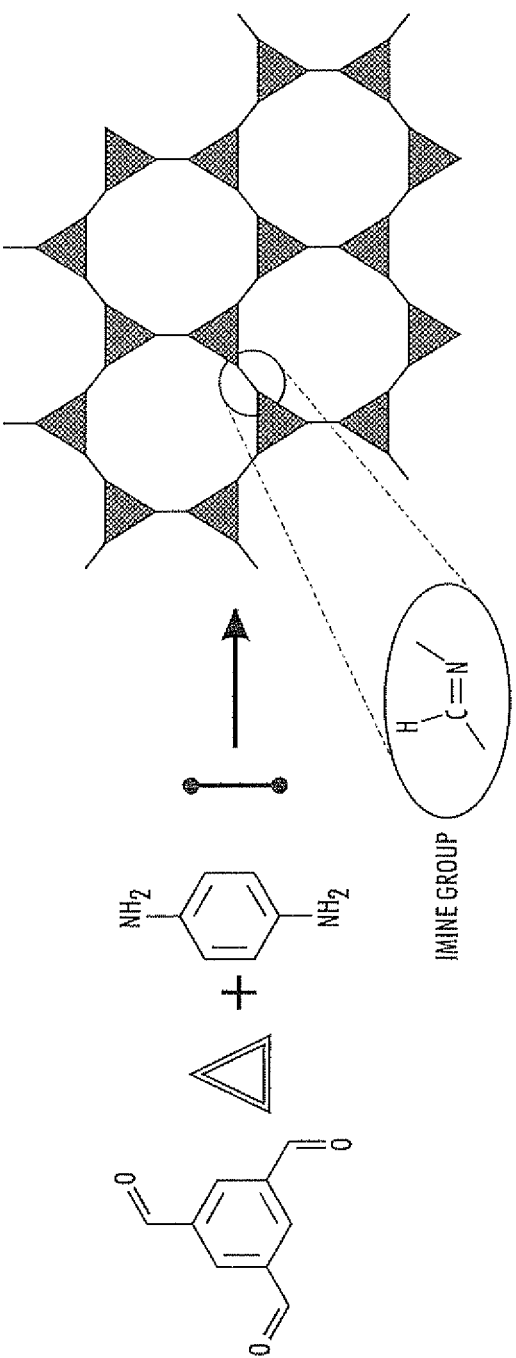
FIG. 2 is an illustration of triangular and linear molecular building blocks used to make an imine-linked hexagonal SOF.

A first molecular building block, 1,3,5-triformylbenzene, (TFB, triangular building block) may be reacted with a second molecular building block, 1,4-diamino benzene, (DAB, linear building block) to form a hexagonally networked SOF (FIG. 2). In this case building blocks would be linked by imine (—HC=N—) bonds.

Figure 3:
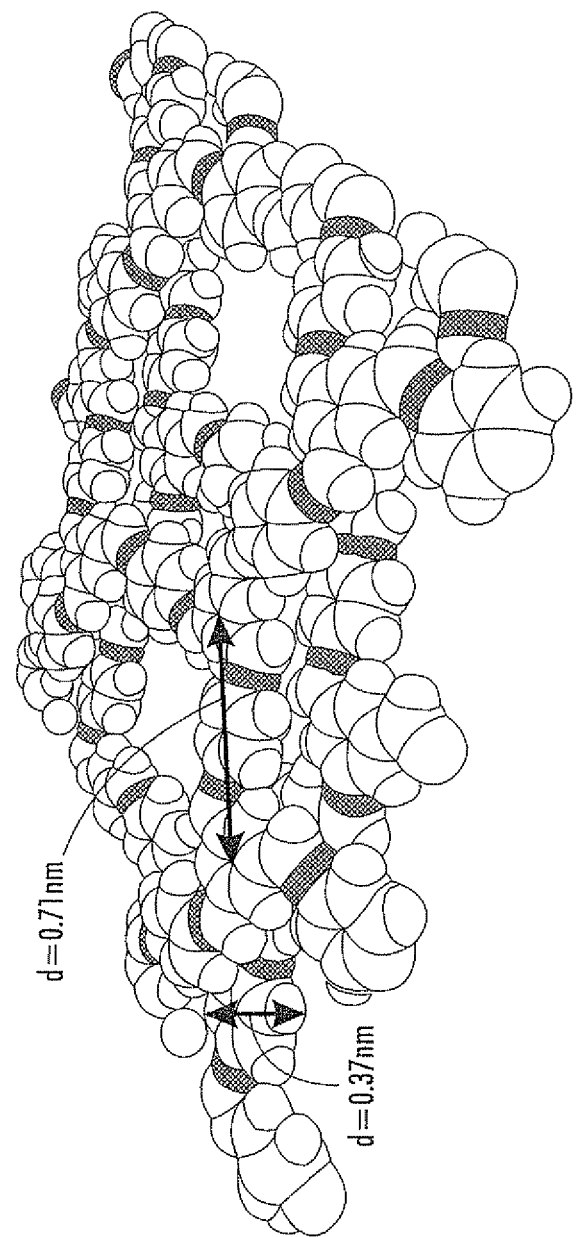
FIG. 3 is an illustration of a molecular-level structure of an imine SOF showing stacking between layers of connected triangular and linear building blocks.
Figure 4:
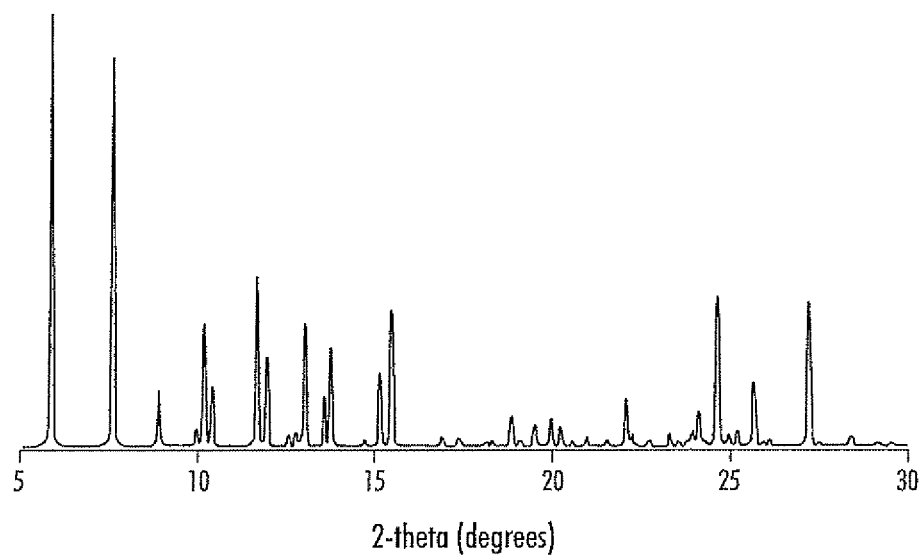
FIG. 4 is a graphic representation of an X-ray diffraction pattern predicted from modeling the SOF structure of the Example.

The hexagonal network depicted in FIG. 2 serves as a template for modeling the periodic SOF at the molecular level (FIG. 3) where intermolecular distances and packing can be ascertained. Because the molecular building blocks are planar molecules and imine bonds are also planer entities a layered structure is predicted from modeling and a structural finger print (X-ray diffraction pattern) can be calculated (FIG. 4).

Figure 5:
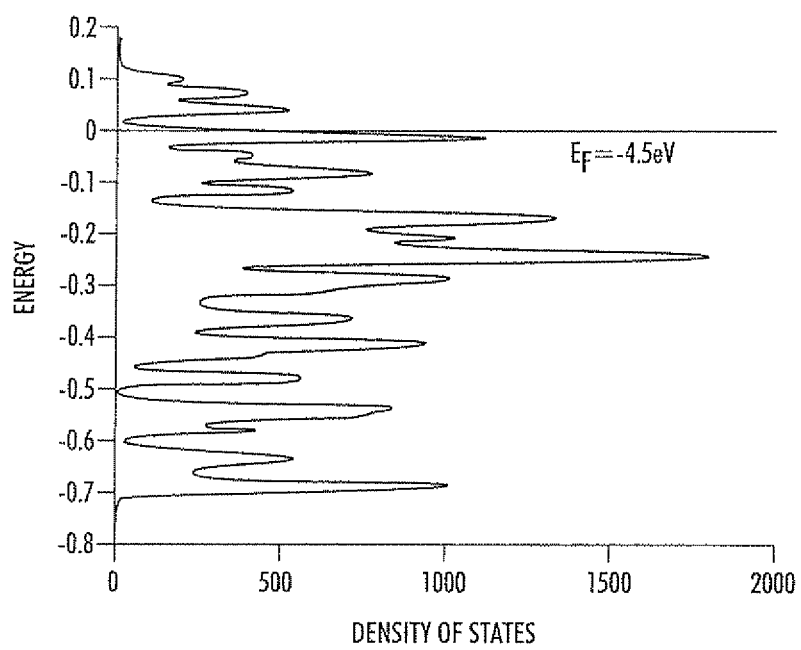
FIG. 5 is a graphic representation of a density of states diagram illustrating the position of the Fermi level within a band that indicates the propensity of this SOF to be an electron conductor.

To understand the electronic properties that can be attained from this SOF, density functional theory and quantum chemical calculations were used to generate a density of states diagram (i.e. molecular orbital diagram for an extended solid) for the material (FIG. 5). It was found that this SOF would possess a Fermi energy level (EF) of −4.5 ev, which lies within a band (i.e. extended orbital energy level) in the density of states diagram. In such a case, it is predicted that the material would behave essentially as a conductor of electrons.

A computer simulation the product of 1,2,-triformylbenzene reacted with 1,4-diamino benzene indicates that a hexagonally networked SOF with these blocks linked by imine bonds should conduct electrons. Density functional theory and quantum chemical calculations were used to generate a density of states diagram that predicts a Fermi level of −4.5 ev, which lies within a band in the density of states diagram predicting electron conductivity. Accordingly, such a planer layered structure should conduct electrons.

It will be appreciated that various of the above-disclosed and other features and functions, or alternatives thereof, may be desirably combined into many other different systems or applications. Also, various presently unforeseen or unanticipated alternatives, modifications, variations or improvements therein may be subsequently made by those skilled in the art, and are also intended to be encompassed by the following claims.

What is claimed is:

1. A high mobility structured organic film (SOF) comprising a plurality of segments and a plurality of linkers arranged as a covalent organic framework (COF), wherein
   at least a portion of the SOF is periodic,
   the SOF is a defect-free film having fewer than 10 pinholes, pores or gaps greater than about 250 nanometers in diameter per $cm^2$, and
   the SOF possesses a mobility ranging from about 0.1 to about 3.0 $cm^2/Vs$.

2. The SOF of claim 1, wherein at least one segment is derived from aryl, arylamine, or thiophene building blocks.

3. The SOF of claim 2, wherein the at least one segment derived from aryl, arylamine, or thiophene building blocks contains at least one core selected from the group consisting of triarylamines, hydrazones, and enamines, arene, heteroarene, nitrofluorenones, 9-fluorenylidenes, malonitriles, diphenoquinones, and naphthalenetetracarboxylic diimides, thiophenes, oligothiophenes, fused thiophenes, perylene bisimides, tetrathiofulvalenes, melamine, porphyrin, and phthalocyanine.

4. The SOF of claim 1, wherein the plurality of linkers are selected from the group consisting of covalent bond linkers, ester linkers, ketone linkers, amide linkers, amine linkers, imine linkers, ether linkers, urethane linkers, and carbonates linkers.

5. The SOF of claim 1, wherein the high mobility SOF comprises a plurality of mono-segment thick SOFs and the plurality of mono-segment thick SOFs form a layered structure.

6. The SOF of claim 1, wherein from about 30% by weight to about 99% by weight of the SOF is periodic.

7. The SOF of claim 1, wherein the portion of the SOF that is periodic is uniformly distributed in the SOF.

8. The SOF of claim 1, wherein the portion of the SOF that is periodic is not uniformly distributed in the SOF.

9. The SOF of claim 1, wherein the periodic portion of the SOF comprises at least one atom of an element that is not carbon.

10. The SOF of claim 1, wherein the SOF is 1 to about 50 segments thick.

11. The SOF of claim 1, wherein the plurality of segments consists of segments having an identical structure and the plurality of linkers consists of linkers having an identical structure.

12. The SOF of claim 1, wherein the SOF is a composite SOF.

13. An electronic device comprising the high mobility SOF of claim 1.

14. The electronic device of claim 13, wherein the electronic device is selected from the group consisting of radio frequency identification tags, photoreceptors, organic light emitting diodes, and thin film transistors, solar cells.

15. The electronic device of claim 13, wherein the electronic device is a electrophotographic imaging member, the electrophotographic imaging member comprising: a supporting substrate, an electrically conductive ground plane, a charge blocking layer, a charge generating layer, a charge transport layer, an overcoat layer, and a ground strip.

16. A process for preparing a structured organic film (SOF) comprising:
   (a) performing a computer simulation and/or materials modeling to formulate a molecular-level structure of a SOF and based on a metric of the computer simulation and/or materials modeling;
   (b) preparing a liquid-containing reaction mixture comprising: a solvent, and
      a plurality of molecular building blocks each comprising a segment and functional groups, wherein the plurality of molecular building blocks is selected based on results obtained from the computer simulation and/or materials modeling;
   (c) depositing the reaction mixture as a wet film; and
   (d) promoting a change of the wet film and forming a dry SOF that substantially replicates the formulated molecular-level structure of the SOF; wherein
      the formulated molecular-level structure of a SOF is a high mobility SOF that possesses a mobility ranging from about 0.1 to about 3.0 $cm^2/Vs$, and
      the SOF is a defect-free film having fewer than 10 pinholes, pores or gaps greater than about 250 nanometers in diameter per $cm^2$.

17. The SOF of claim 1, wherein the mobility of the SOF is in the range of from about 0.2 to about 2.0 $cm^2/Vs$.

18. The SOF of claim 1, wherein the SOF possess a thermal stability higher than 400° C. under atmospheric conditions.

* * * * *